United States Patent
Uchida

(10) Patent No.: US 10,756,109 B2
(45) Date of Patent: Aug. 25, 2020

(54) SEMICONDUCTOR DEVICE

(71) Applicant: Toshiba Memory Corporation, Minato-ku (JP)

(72) Inventor: Keisuke Uchida, Yokkaichi (JP)

(73) Assignee: Toshiba Memory Corporation, Minato-ku (JP)

(*) Notice: Subject to any disclaimer, the term of this patent is extended or adjusted under 35 U.S.C. 154(b) by 16 days.

(21) Appl. No.: 16/286,665

(22) Filed: Feb. 27, 2019

(65) Prior Publication Data

US 2020/0083248 A1 Mar. 12, 2020

(30) Foreign Application Priority Data

Sep. 6, 2018 (JP) ................................. 2018-166980

(51) Int. Cl.
*H01L 27/11582* (2017.01)
*H01L 27/11565* (2017.01)
*H01L 27/1157* (2017.01)
*G11C 5/06* (2006.01)

(52) U.S. Cl.
CPC ........ *H01L 27/11582* (2013.01); *G11C 5/063* (2013.01); *H01L 27/1157* (2013.01); *H01L 27/11565* (2013.01)

(58) Field of Classification Search
CPC ......... H01L 27/11582; H01L 27/11565; H01L 27/1157; G11C 5/063
See application file for complete search history.

(56) References Cited

U.S. PATENT DOCUMENTS

| | | | |
|---|---|---|---|
| 8,237,213 B2 | 8/2012 | Liu | |
| 8,722,525 B2* | 5/2014 | Sinha | H01L 21/31111 438/593 |
| 9,397,110 B2* | 7/2016 | Lue | H01L 27/1157 |
| 9,711,522 B2 | 7/2017 | Park et al. | |
| 2012/0001249 A1 | 1/2012 | Alsmeier et al. | |
| 2016/0099254 A1 | 4/2016 | Park et al. | |
| 2016/0336339 A1* | 11/2016 | Cheng | G11C 5/063 |
| 2017/0062456 A1* | 3/2017 | Sugino | H01L 27/1157 |

(Continued)

FOREIGN PATENT DOCUMENTS

| | | |
|---|---|---|
| CN | 109449159 A | 3/2019 |
| JP | 2013-531390 | 8/2013 |
| JP | 2013-534058 | 8/2013 |

(Continued)

*Primary Examiner* — Mark W Tornow

(74) *Attorney, Agent, or Firm* — Oblon, McClelland, Maier & Neustadt, L.L.P.

(57) ABSTRACT

A semiconductor device according to an embodiment includes a first dielectric film wall configured to separate one elliptic cylinder region into two regions in a long diameter direction of an ellipse, a first memory film disposed in a tubular shape along a sidewall surface of one region of the two regions, a second memory film disposed in a tubular shape along a sidewall surface of another region of the two regions, first wire groups connected to the first memory film, second wire groups provided in the same layers as the first wire groups and parallel to the first wire groups, and connected to the second memory film, and a second dielectric film wall formed integrally with the first dielectric film wall and separating the plurality of layers of the first wire groups and the plurality of layers of the second wire groups.

20 Claims, 21 Drawing Sheets

(56) References Cited

U.S. PATENT DOCUMENTS

2019/0067311 A1 2/2019 Yoshimizu et al.
2019/0067319 A1 2/2019 Yoshimizu

FOREIGN PATENT DOCUMENTS

| JP | 2017-50527 | 3/2017 |
| JP | 2019-46918 A | 3/2019 |
| TW | 201913961 A | 4/2019 |
| WO | WO 2012/003301 A2 | 1/2012 |

* cited by examiner

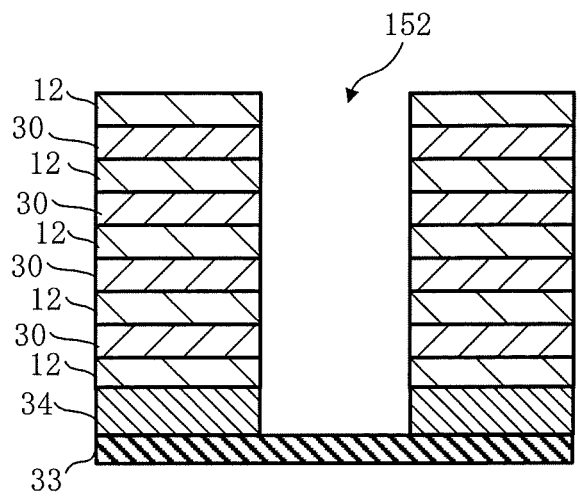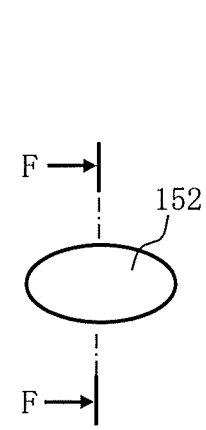
FIG.21A  FIG.21B
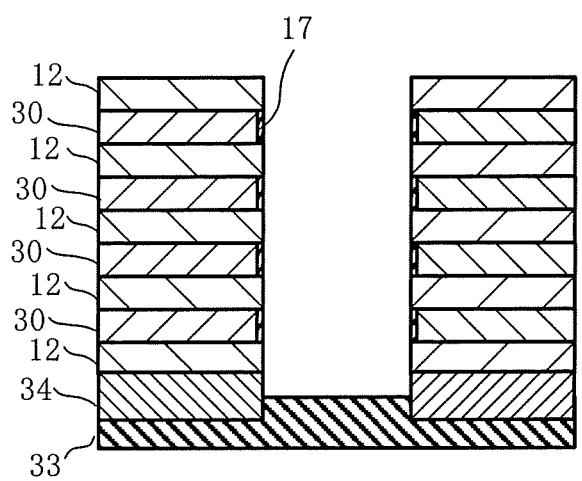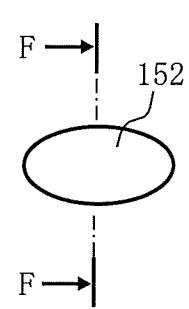
FIG.21C  FIG.21D
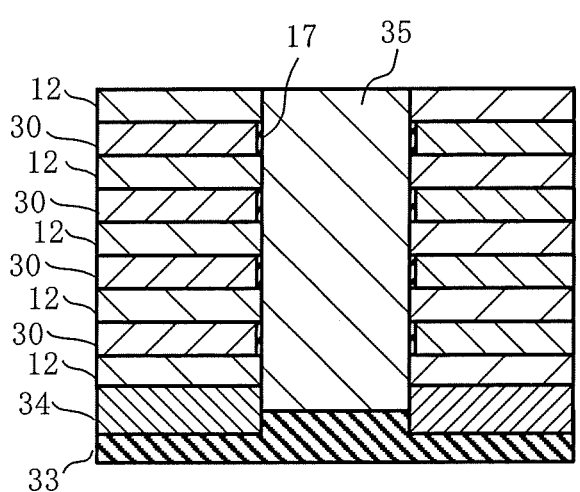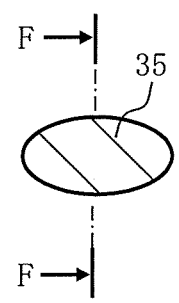
FIG.21E  FIG.21F

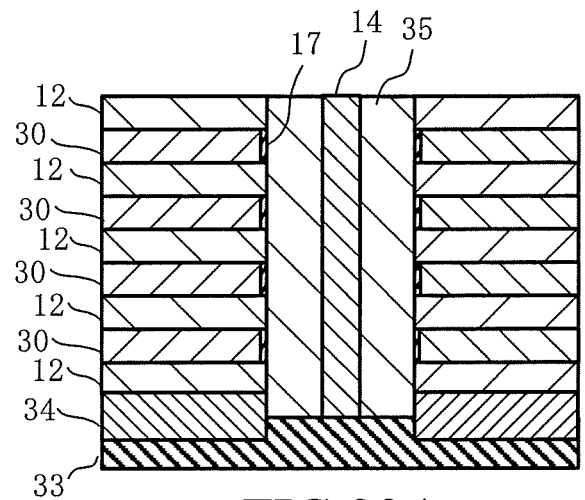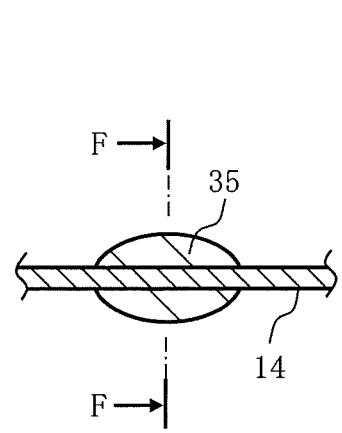
FIG.22A  FIG.22B
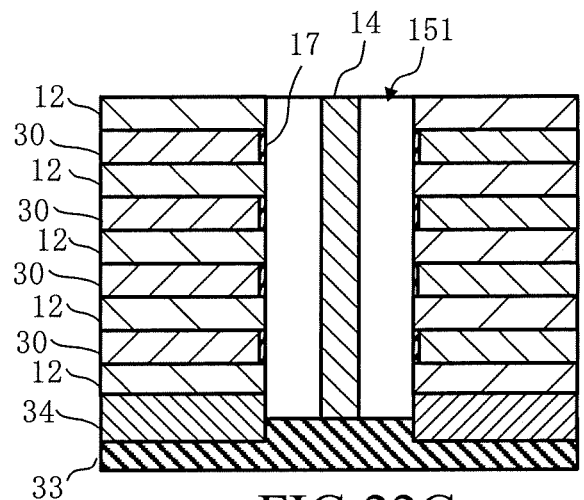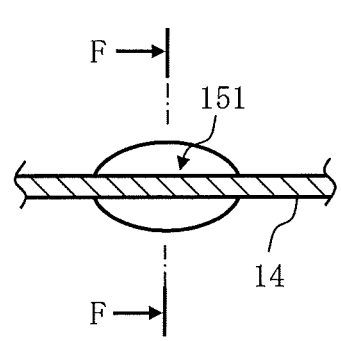
FIG.22C  FIG.22D
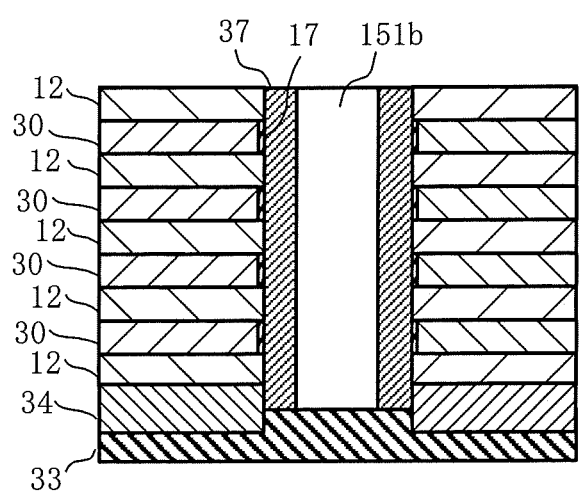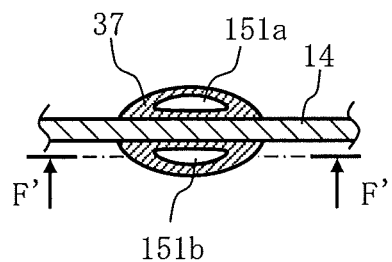
FIG.22E  FIG.22F

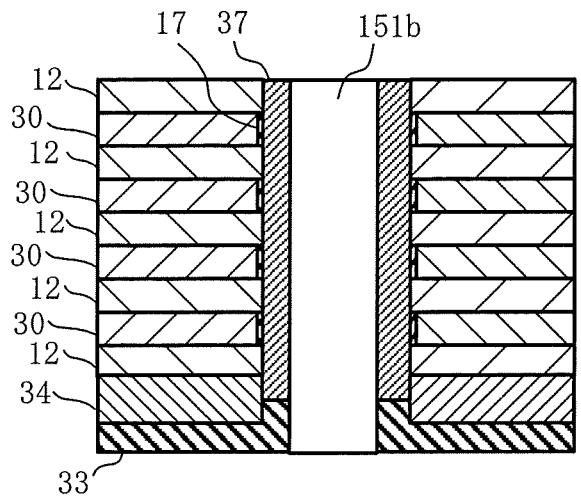 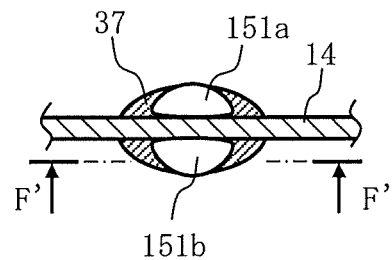
FIG.23A  FIG.23B
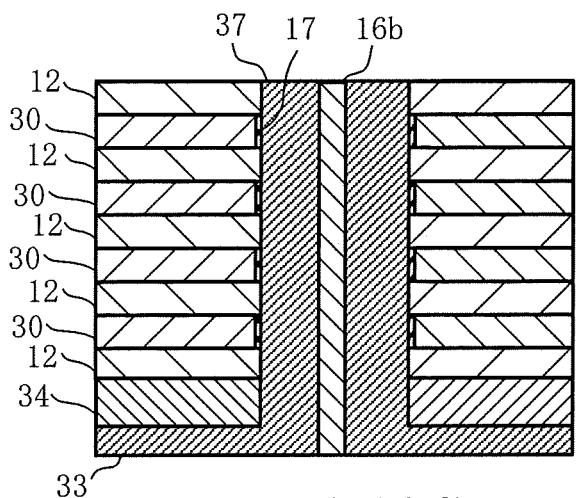 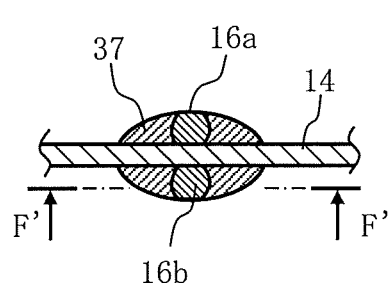
FIG.23C  FIG.23D
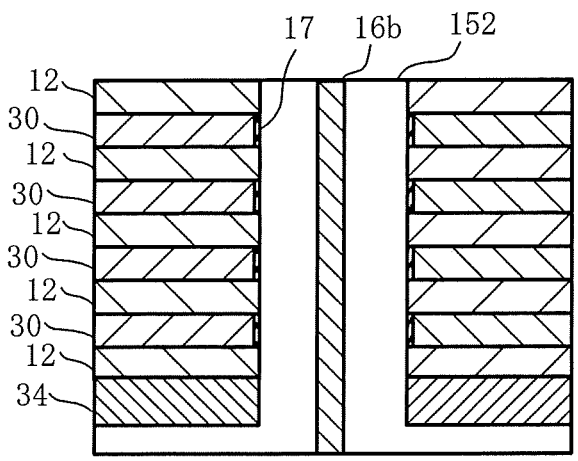 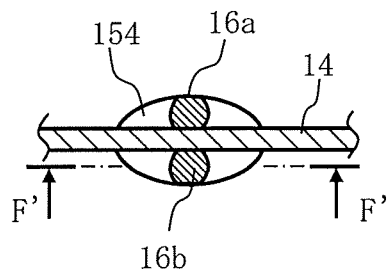
FIG.23E  FIG.23F

US 10,756,109 B2

SEMICONDUCTOR DEVICE

CROSS-REFERENCE TO RELATED APPLICATION

This application is based upon and claims the benefit of priority from Japanese Patent Application No. 2018-166980 filed on Sep. 6, 2018 in Japan, the entire contents of which are incorporated herein by reference.

FIELD

Embodiments described herein relate generally to a semiconductor device.

BACKGROUND

In the development of semiconductor devices, particularly, semiconductor storage devices, miniaturization of memory cells has been advanced to achieve a large capacity, a low cost, and the like. For example, the development of a three-dimensional NAND type flash memory device in which memory cells are three-dimensionally disposed has been advanced. In the three-dimensional NAND type flash memory device, a NAND string in which memory cells are connected in a direction (so-called vertical direction) perpendicular to surfaces of word line layers is formed in the word line layers stacked with a dielectric layer therebetween. As a result, high integration is achieved as compared with a case where the memory cells are two-dimensionally disposed. To achieve higher integration, it has been proposed to divide a memory film physically by vertical division using lithography technology to form a plurality of memory films extending in the vertical direction to thereby form memory cells, for example, twice as many as existing memory cells. However, if the formed memory film is physically divided using the lithography technology, a memory film structure may be damaged.

BRIEF DESCRIPTION OF THE DRAWINGS

FIGS. 21A to 21F are cross-sectional and cross-sectional position diagrams showing a part of the steps of the method for fabricating the semiconductor device according to the third embodiment;

FIGS. 22A to 22F are cross-sectional and cross-sectional position diagrams showing another part of the steps of the method for fabricating the semiconductor device according to the third embodiment;

FIGS. 23A to 23F are cross-sectional and cross-sectional position diagrams showing another part of the steps of the method for fabricating the semiconductor device according to the third embodiment;

DETAILED DESCRIPTION

A semiconductor device according to an embodiment includes a first dielectric film wall, a first memory film, a second memory film, first wire groups, second wire groups, a first channel film, a second channel film, and a second dielectric film wall. The first dielectric film wall is configured to separate one elliptic cylinder region into two regions in a long diameter direction of an ellipse. The first memory film is disposed in a tubular shape along a sidewall surface of one region of the two regions into which the elliptic cylinder region is separated by the first dielectric film wall and has a first charge accumulation film. The second memory film is disposed in a tubular shape along a sidewall surface of another region of the two regions into which the elliptic cylinder region is separated by the first dielectric film wall and has a second charge accumulation film. The first wire groups is provided in a plurality of layers in a longitudinal direction of the elliptic cylinder region, each of the first wire groups having a plate shape, extending in a direction orthogonal to the longitudinal direction of the elliptic cylinder region, and being connected to the first memory film. The second wire groups is provided in a plurality of layers being the same layers as the first wire groups, each of the second wire groups having a plate shape, being parallel to the first wire groups, extending in the direction orthogonal to the longitudinal direction of the elliptic cylinder region, and being connected to the second memory film. The first channel film is disposed in a columnar shape along an inner wall surface of the first memory film. The second channel film is disposed in a columnar shape along an inner wall surface of the second memory film. The second dielectric film wall is formed integrally with the first dielectric film wall and separates the plurality of layers of the first wire groups and the plurality of layers of the second wire groups.

In the following embodiments, a semiconductor device in which higher integration of a three-dimensional NAND type flash memory device is enabled will be described.

Further, in the following embodiments, a three-dimensional NAND type flash memory device will be described as an example of a semiconductor device. Hereinafter, description will be given using the drawings.

First Embodiment

Figure 1:
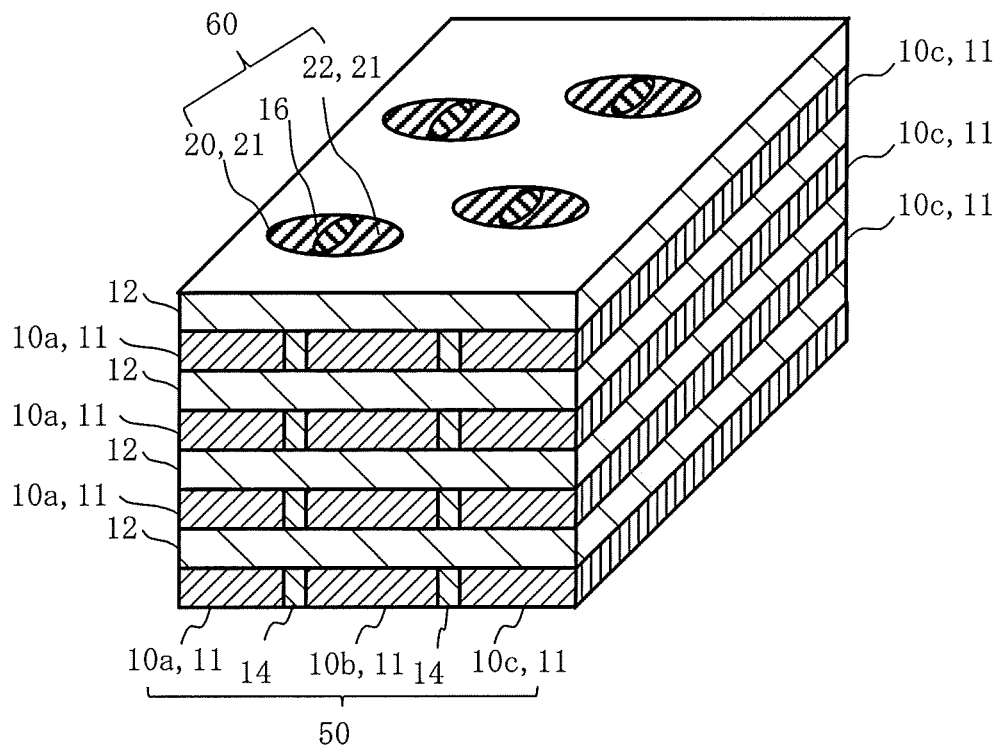
FIG. 1 is a perspective view showing an example of a configuration of a semiconductor device according to a first embodiment.
Figure 2:
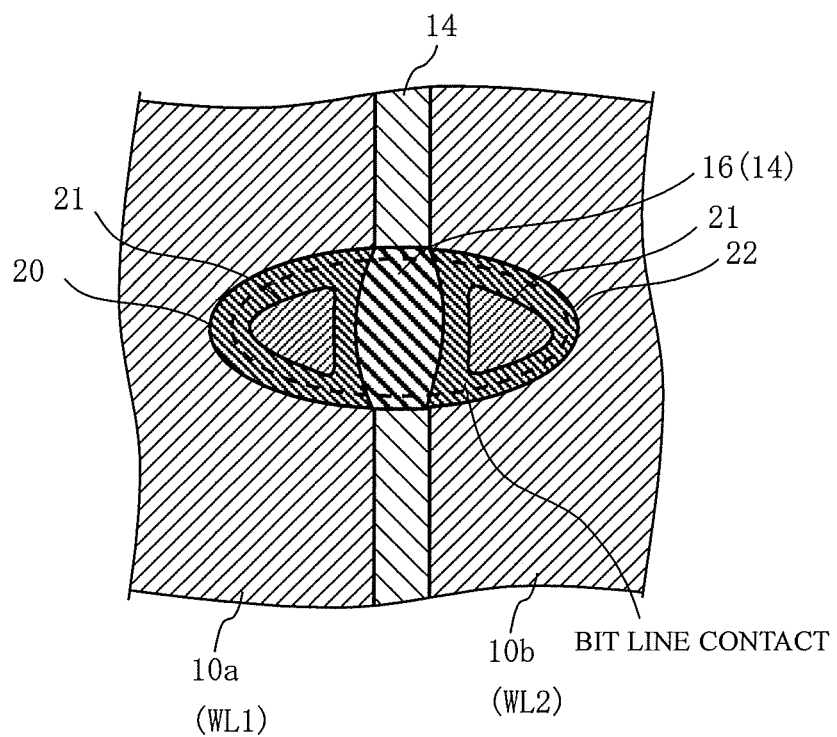
FIG. 2 is a top view showing an example of a configuration of a conductive layer and a memory cell of the semiconductor device according to the first embodiment.

FIG. 1 is a perspective view showing an example of a configuration of a semiconductor device according to a first embodiment. FIG. 2 is a top view showing an example of a configuration of a conductive layer and a memory cell of the semiconductor device according to the first embodiment; It is to be noted that the scales are not matched in FIGS. 1 and 2. In the examples of FIGS. 1 and 2, an example of a configuration of a memory element region in a semiconductor storage device to be an example of a semiconductor device is shown. In FIG. 1, a channel film 21 and a barrier metal film 11 are denoted only by reference numerals and illustration thereof is omitted. In FIG. 1, the semiconductor device according to the first embodiment has a plurality of layers of conductive layers 50 in which a plurality of wires 10a, 10b, and 10c to be word lines (WL) in the semiconductor storage device are formed in parallel. Further, the semiconductor device according to the first embodiment has a plurality of layers of dielectric layers 12 that insulate the conductive layers 50 adjacent to each other. The conductive layer 50 of each layer of the plurality of layers of conductive layers 50 and the dielectric layer 12 of each layer of the plurality of layers of dielectric layers 12 are alternately stacked. A group (first wire group) of the plurality of layers of wires 10a and a group (second wire group) of the plurality of layers of wires 10b are separated by a dielectric film wall 14 (second dielectric film wall). Similarly, a group of the plurality of layers of wires 10b and a group of the plurality of layers of wires 10c are separated by a dielectric film wall 14. As such, the plurality of wires 10a, 10b, and 10c in the conductive layer 50 of each layer are separated by the dielectric film walls 14. In the conductive layer 50 of each layer, the wire 10a (WL1: an example of a first wire) is formed at the same position. Similarly, in the conductive layer 50 of each layer, the wire 10b (WL2: an example of a second wire) is formed at the same position. Similarly, in the conductive layer 50 of each layer, the wire 10c is formed at the same position. The plurality of wires 10a, 10b, and 10c are plate-like wires using the same conductive material.

A plurality of elliptic cylinder regions 60 are disposed in a row in portions where the wires 10a and the wires 10b face each other with the dielectric film walls 14 therebetween. Further, a plurality of elliptic cylinder regions 60 are disposed in a row in portions where the wires 10b and the wires 10c face each other with the dielectric film walls 14 therebetween. Each elliptic cylinder region 60 penetrates a stacked body of the plurality of layers of conductive layers 50 and the plurality of layers of dielectric layers 12 in a direction orthogonal to a stacked surface. The plurality of elliptic cylinder regions 60 in adjacent rows are disposed in a zigzag shape in plan view, for example. In each elliptic cylinder region 60, two memory films 20 and 22 are disposed. The memory film 20 (first memory film) is disposed in one of two regions obtained by separating the one elliptic cylinder region 60 in a long diameter direction of an ellipse by a dielectric film wall 16 (first dielectric film wall). The memory film 22 (second memory film) is disposed in the other of the two regions obtained by separating the one elliptic cylinder region 60 in the long diameter direction of the ellipse by the dielectric film wall 16 (first dielectric film wall). As such, the dielectric film wall 16 separates each elliptic cylinder region 60 into the two regions in the long diameter direction of the ellipse. The channel film 21 (first channel film) (also referred to as a channel body) is disposed in a columnar shape along an inner wall surface of the memory film 20 (first memory film). Similarly, the channel film 21 (second channel film) is disposed in a columnar shape along an inner wall surface of the memory film 22 (second memory film). In other words, the dielectric film wall 16, the memory films 20 and 22, and the channel films 21 inside the memory films 20 and 22 are disposed in each elliptic cylinder region 60. Thus, in the examples of FIGS. 1 and 2, a plurality of elliptic cylinder regions 60 each of which is provided with the dielectric film wall 16, the memory films 20 and 22, and the channel films 21 in the memory films 20 and 22, and a plurality of portions where the plurality of layers of the wires 10a (first wire groups) and the plurality of layers of the wires 10b (second wire groups) face each other with the dielectric film wall 14 therebetween, are alternately arranged one by one in the short diameter direction of the ellipse of the elliptic cylinder region 60. In the examples of FIGS. 1 and 2, the dielectric film wall 14 separating the wire 10a and the wire 10b of the conductive layer 50 of each layer is formed integrally with the dielectric film wall 16 of the elliptic cylinder region 60 located at the portion where the wire 10a and the wire 10b face each other. Similarly, the dielectric film wall 14 separating the wire 10b and the wire 10c of the conductive layer 50 of each layer is formed integrally with the dielectric film wall 16 of the elliptic cylinder region 60 located at the portion where the wire 10b and the wire 10c face each other. It is to be noted that the "elliptic cylinder" in the embodiment is not limited to an elliptic cylinder where a horizontal cross-section has a true elliptic shape and may be an elliptic cylinder where a curved surface on one side of the long diameter direction and a curved surface on the other side are connected by a plane and a horizontal cross-section has a so-called oval shape.

As shown in FIGS. 1 and 2, the groups of wires 10a of the plurality of layers of conductive layers 50 are formed in a plurality of layers in a longitudinal direction of the elliptic cylinder regions 60 located at the portions where the wires 10a and the wires 10b face each other with the dielectric film walls 14 therebetween. As described above, each group of wires 10a of the plurality of layers of conductive layers 50 has a plate shape and extends in a direction orthogonal to the longitudinal direction of the column of the elliptic cylinder region 60. In the examples of FIGS. 1 and 2, the group of wires 10a of the plurality of layers of conductive layers 50 extends in a short diameter direction of the ellipse of the elliptic cylinder region 60. The group of wires 10a is connected to the memory film 20 of each elliptic cylinder region 60 located at the portions where the wires 10a and the wires 10b face each other with the dielectric film walls 14 therebetween. The groups of wires 10b of the plurality of layers of conductive layers 50 are provided in a plurality of layers in the same layers as the groups of wires 10a. Each group of wires 10b has a plate shape, is parallel to the group of wires 10a, and extends in a direction orthogonal to the longitudinal direction of the column of the elliptic cylinder region 60 located at the portion where the wires 10a and the wires 10b face each other with the dielectric film walls 14 therebetween. In the examples of FIGS. 1 and 2, the group of wires 10b of the plurality of layers of conductive layers 50 extends in the short diameter direction of the ellipse of the elliptic cylinder region 60. The group of wires 10b is connected to the memory film 22 of each elliptic cylinder region 60 located at the portions where the wires 10a and the wires 10b face each other with the dielectric film walls 14 therebetween. The group of wires 10b of the conductive layer 50 of each layer extends in a direction orthogonal to the longitudinal direction of the column of the elliptic cylinder region 60 located at the portion where the wires 10b and the wires 10c face each other with the dielectric film walls 14 therebetween. The group of wires 10b is also connected to the memory film 20 of the elliptic cylinder region 60 located at the portion where the wires 10b and the wires 10c face each other with the dielectric film walls 14 therebetween. The groups of wires 10c of the plurality of layers of conductive layers 50 are provided in a plurality of layers in the same layers as the groups of wires 10a and 10b. Each group of wires 10c has a plate shape, is parallel to the groups of wires 10a and 10b, and extends in a direction orthogonal to the longitudinal direction of the column of the elliptic cylinder region 60 located at the portion where the wires 10b and the wires 10c face each other with the dielectric film walls 14 therebetween. The group of wires 10c is connected to the memory film 22 of the elliptic cylinder region 60 located at the portion where the wires 10b and the wires 10c face each other with the dielectric film walls 14 therebetween. In the conductive layer 50 of each layer, the combination of the wire 10a to be a word line, the memory film 20 of one elliptic cylinder region 60 located at the portion where the wire 10a and the wire 10b face each other with the dielectric film wall 14 therebetween, and the channel film 21 surrounded by the memory film 20 constitutes one memory cell. One NAND string is constituted by a plurality of memory cells in which the memory cells formed in each of the plurality of layers of conductive layers 50 to be connected to the memory film 20 of the same elliptic cylinder region 60 are connected by the channel film 21 of the same elliptic cylinder region 60. Similarly, in the conductive layer 50 of each layer, the combination of the wire 10b to be a word line, the memory film 22 of one elliptic cylinder region 60 located at the portion where the wire 10a and the wire 10b face each other with the dielectric film wall 14 therebetween, and the channel film 21 surrounded by the memory film 22 constitutes one memory cell. One NAND string is constituted by a plurality of memory cells in which the memory cells formed in each of the plurality of layers of conductive layers 50 to be connected to the memory film 22 of the same elliptic cylinder region 60 are connected by the channel film 21 of the same elliptic cylinder region 60. Similarly, in the conductive layer 50 of each layer, the combination of the wire 10b to be a word line, the memory film 20 of one elliptic cylinder region 60 located at the portion where the wire 10b and the wire 10c face each other with the dielectric film wall 14 therebetween, and the channel film 21 surrounded by the memory film 20 constitutes one memory cell. One NAND string is constituted by a plurality of memory cells in which the memory cells formed in each of the plurality of layers of conductive layers 50 to be connected to the memory film 20 of the same elliptic cylinder region 60 are connected by the channel film 21 of the same elliptic cylinder region 60. Similarly, in the conductive layer 50 of each layer, the combination of the wire 10c to be a word line, the memory film 22 of one elliptic cylinder region 60 located at the portion where the wire 10b and the wire 10c face each other with the dielectric film wall 14 therebetween, and the channel film 21 surrounded by the memory film 22 constitutes one memory cell. One NAND string is constituted by a plurality of memory cells in which the memory cells formed in each of the plurality of layers of conductive layers 50 to be connected to the memory film 22 of the same elliptic cylinder region 60 are connected by the channel film 21 of the same elliptic cylinder region 60. A bit line contact is connected across the channel film 21 surrounded by the memory film 20 and the channel film 21 surrounded by the memory film 22 of the same elliptic cylinder region 60. In other words, one end on the same side of the NAND string using the memory film 20 and the NAND string using the memory film 22 formed in the same elliptic cylinder region 60 is connected to a common bit line contact and the other end is connected to a common source line.

As described above, in the first embodiment, in each conductive layer 50, instead of forming one memory cell by a combination of one memory film and one channel film, two memory cells by a combination of the memory film 20 and the channel film 21 and a combination of the memory film 22 and the channel film 21 are formed in the same elliptic cylinder region 60, so that the density of the memory cells can be increased. Therefore, higher integration can be achieved in the three-dimensional NAND type flash memory device.

Figure 3:
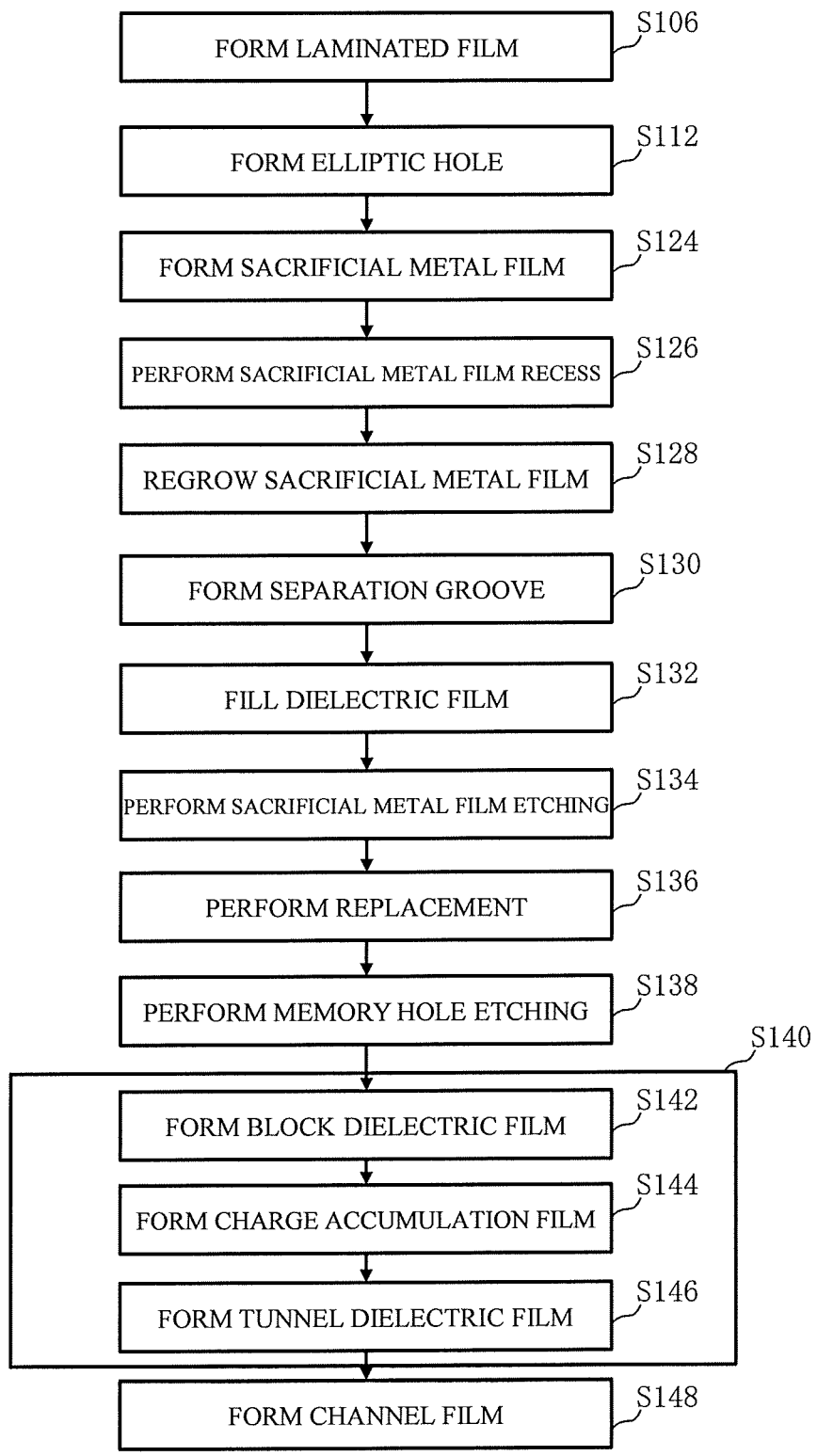
FIG. 3 is a flowchart showing main steps of a method for fabricating the semiconductor device according to the first embodiment.

FIG. 3 is a flowchart showing main steps of a method for fabricating the semiconductor device according to the first embodiment. In FIG. 3, in the method for fabricating the semiconductor device according to the first embodiment, a series of steps including a stacked film formation step (S106), an elliptic hole formation step (S112), a sacrificial metal film formation step (S124), a sacrificial metal film recess step (S126), a sacrificial metal film regrowth step (S128), a separation groove formation step (S130), a dielectric film formation step (S132), a sacrificial metal film etching step (S134), a replacement step (S136), a memory hole etching step (S138), a memory film formation step (S140), and a channel film formation step (S148) is executed. In the memory film formation step (S140), a series of steps including a block dielectric film formation step (S142), a charge accumulation film formation step (S144), and a tunnel dielectric film formation step (S146) is executed as internal steps.

Figure 4A:
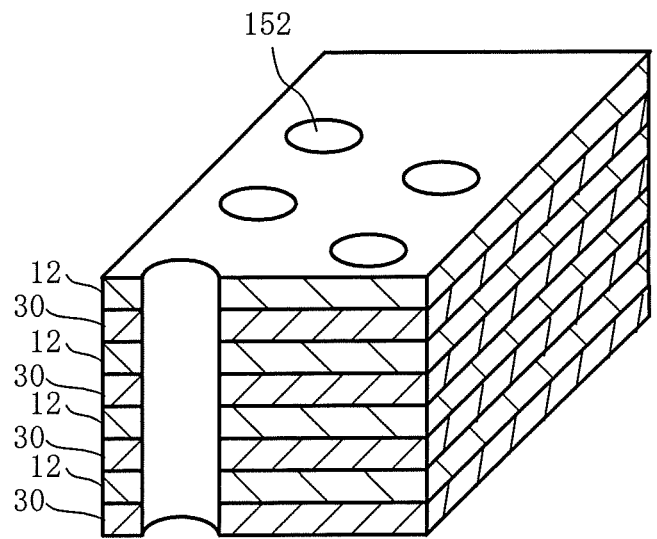
FIGS. 4A to 4C are perspective views showing a part of the steps of the method for fabricating the semiconductor device according to the first embodiment.
Figure 4B:
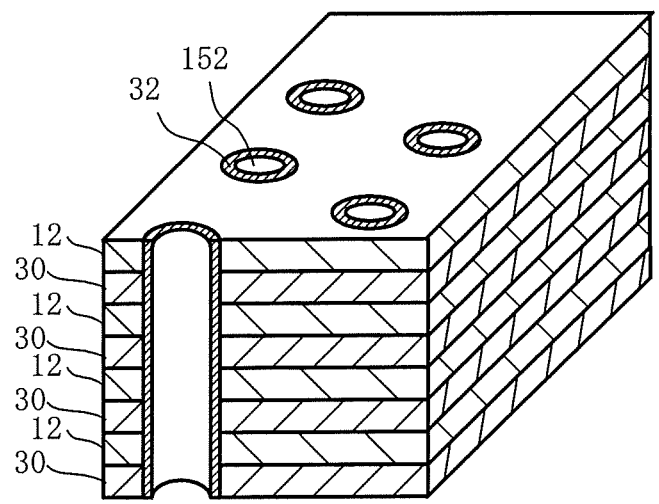
Figure 4C:
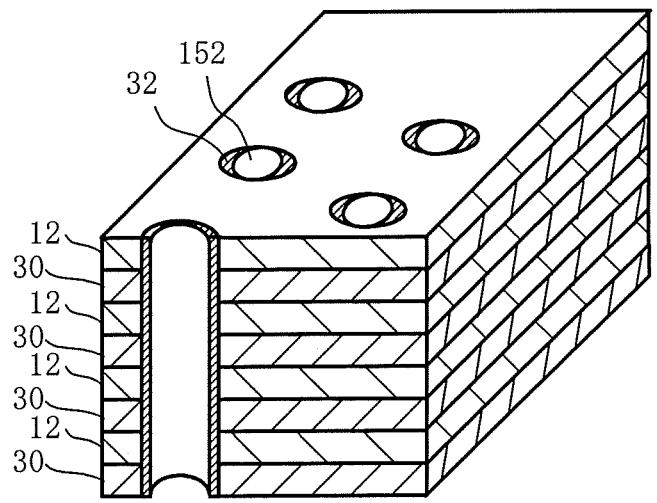

FIGS. 4A to 4C are perspective views showing a part of the steps of the method for fabricating the semiconductor device according to the first embodiment. FIGS. 4A to 4C show the stacked film formation step (S106) to the sacrificial metal film recess step (S126) in FIG. 3. The subsequent steps will be described later.

First, as the stacked film formation step (S106), sacrificial film layers 30 and dielectric layers 12 are alternately stacked on a semiconductor substrate not shown in the drawings by using an atomic layer vapor phase growth (atomic layer deposition: ALD or atomic layer chemical vapor deposition: ALCVD) method or a chemical vapor deposition (CVD) method, for example. By this step, a stacked film in which each of the plurality of layers of sacrificial film layers 30 and each of the plural layers of dielectric layers 12 are alternately stacked is formed. As a sacrificial film used for the sacrificial film layer 30, for example, a silicon nitride film (SiN film) is preferably used. As a dielectric film used for the dielectric layer 12, for example, a silicon oxide film ($SiO_2$ film) is preferably used. As the semiconductor substrate, for example, a silicon wafer having a diameter of 300 mm is used. On or in the semiconductor substrate in which the sacrificial film layers 30 and the dielectric layers 12 are alternately stacked, other dielectric films, wires, contacts, and/or semiconductor elements such as transistors, which are not shown in the drawings, may be formed.

In FIG. 4A, as the elliptic hole formation step (S112), an elliptic opening (elliptic hole 152) penetrating the stacked film from the dielectric layer 12 is formed. Here, a plurality of elliptic holes 152 are formed along the longitudinal direction of the wires 10 at positions between the adjacent wires 10 to be the word lines shown in FIG. 1. In a state in which a resist film is formed on the dielectric layer 12 through a lithography step such as a resist coating step and an exposing step not shown in the drawings, the exposed dielectric layer 12 and a stacked film of the sacrificial film layer 30 and the dielectric layer 12 located below the exposed dielectric layer 12 are removed by an anisotropic etching method. As a result, the elliptic hole 152 can be formed substantially perpendicularly to a surface of the dielectric layer 12. For example, the elliptic hole 152 may be formed by a reactive ion etching (RIE) method. Here, each elliptic hole 152 is preferably formed so that the long diameter direction is oriented in a direction substantially orthogonal to the longitudinal direction of the wire 10 to be the word line shown in FIG. 1. In addition, each elliptic hole 152 is not limited to a complete elliptic shape. Each elliptic hole 152 may have a shape which has a long diameter and a short diameter and in which a curvature of a side portion in a long diameter direction is larger than a curvature of a side portion in a short diameter direction. For example, each elliptic hole 152 may have the oval shape or the like.

In FIG. 4B, as the sacrificial metal film formation step (S124), a sacrificial metal film 32 is formed in the elliptic hole 152 by using the ALD method, the ALCVD method, or the CVD method, for example. As a material of the sacrificial metal film 32, for example, it is preferable to use tungsten (W). Here, deposition is not performed until the elliptic hole 152 is completely filled with the sacrificial metal film 32. For example, it is desirable to form the sacrificial metal film 32 so that a cavity not yet filled remains in a columnar shape in a center portion of the ellipse of the elliptic hole 152. In the first embodiment, formation of the sacrificial metal film 32 is advanced faster in the sidewall portion of the long diameter direction having a small curvature radius (large curvature) than in the sidewall portion of the short diameter direction having a large curvature radius (small curvature) to fill the elliptic hole 152 with the sacrificial metal film 32. Therefore, the thickness of the sacrificial metal film 32 formed on the sidewall portion of the long diameter direction having the large curvature rather than the sidewall portion of the short diameter direction having the small curvature can be increased.

In FIG. 4C, as the sacrificial metal film recess step (S126), a recess shape is formed in the sacrificial metal film 32 by etching the sacrificial metal film 32 in the elliptic hole 152 by a wet etching method (for example, mixed acid treatment), for example. Specifically, the recess shape of the sacrificial metal film 32 is formed so that the sacrificial metal film 32 in the sidewall portion of the short diameter direction having the small curvature is removed and the sacrificial metal film 32 remains in the sidewall portion of the long diameter direction having the large curvature.

Figure 5A:
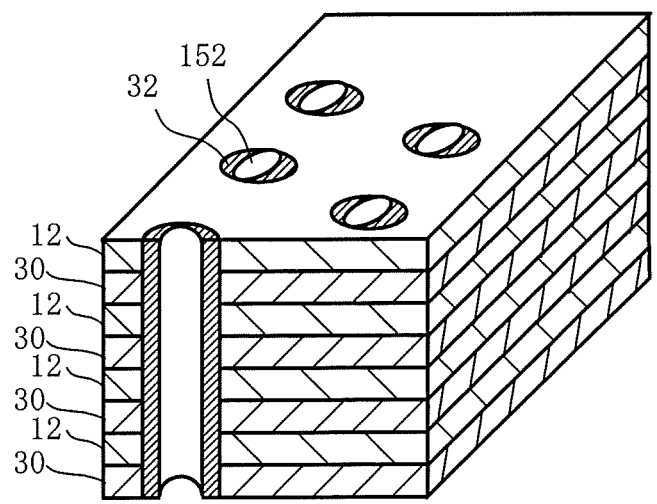
FIGS. 5A to 5C are perspective views showing another part of the steps of the method for fabricating the semiconductor device according to the first embodiment.
Figure 5B:
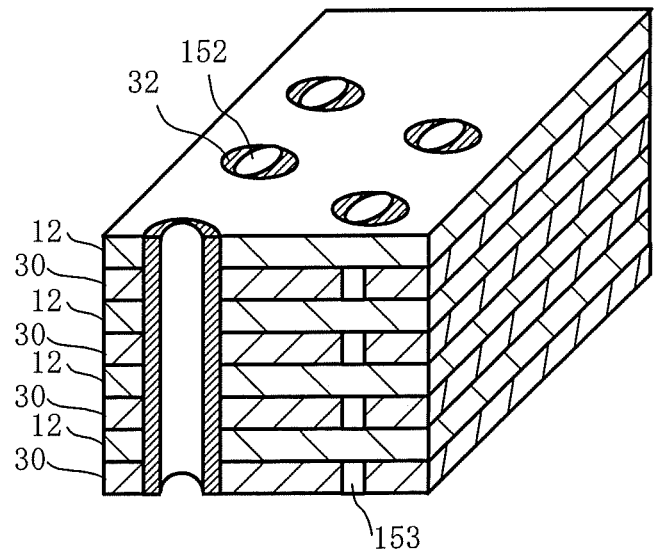
Figure 5C:
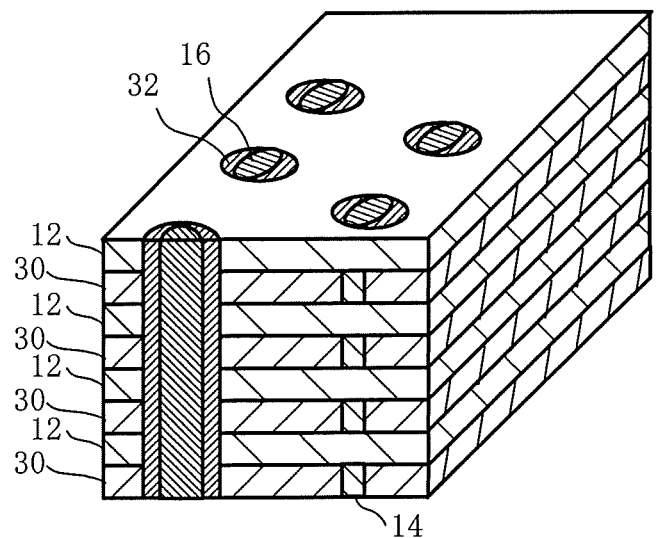

FIGS. 5A to 5C are perspective views showing another part of the steps of the method for fabricating the semiconductor device according to the first embodiment; FIGS. 5A to 5C show the sacrificial metal film regrowth step (S128) to the dielectric film formation step (S132) in FIG. 3. The subsequent steps will be described later.

In FIG. 5A, as the sacrificial metal film regrowth step (S128), the sacrificial metal film 32 having the recess shape in the elliptic hole 152 is regrown by using the ALD method, the ALCVD method, or the CVD method, for example. In the sidewall portion of the long diameter direction having the large curvature, the sacrificial metal film 32 having the recess shape becomes a base film and formation of the sacrificial metal film 32 is advanced. Therefore, before the growth of the sacrificial metal film 32 starts in the sidewall portion of the short diameter direction where the base film does not exist and the curvature is small, a small space (small region) between both the sidewall portions of the short diameter direction is left and the elliptic hole 152 can be filled with the sacrificial metal film 32. By this step, two regions in the elliptic hole 152 separated by the space between both the sidewall portions in the short diameter direction can be filled with the sacrificial metal film 32, in a state where the sacrificial metal film 32 does not exist in both the sidewall portions in the short diameter direction and the space between both the sidewall portions.

In FIG. 5B, as the separation groove formation step (S130), a separation groove 153 is formed in each of the plurality of layers of sacrificial film layers 30 through the space between both the sidewall portions of the short diameter direction left in the elliptic hole 152 by a wet etching method (for example, hot phosphoric acid treatment). Here, the plurality of elliptic holes 152 are formed along the longitudinal direction of the wires 10 at the positions between the adjacent wires 10 to be the word lines shown in FIG. 1 and the short diameter direction of the elliptic hole 152 are oriented in the longitudinal direction of the wires 10. The sacrificial metal film 32 does not exist on both the sidewall portions in the short diameter direction and the dielectric film of the dielectric layer 12 and the sacrificial film of the sacrificial film layer 30 are exposed. Therefore, by selectively etching the sacrificial film of the sacrificial film layer 30 of each layer, etching (side etching) of the sacrificial film layer 30 having directivity in the longitudinal direction of the wire 10 can be advanced from a portion exposed from the sacrificial metal film 32 in each elliptic hole 152. As a result, since the distance between the elliptic holes 152 is short, the spaces between both the sidewall portions of the short diameter direction in each elliptic hole 152 are continuous along the direction of the directivity. In other words, the separation groove 153 for separating the sacrificial film layer 30 of each layer into a plurality of sacrificial films can be formed along the longitudinal direction of the wire 10 shown in FIG. 1.

In FIG. 5C, as the dielectric film formation step (S132), the space between both the sidewall portions of the short diameter direction in each elliptic hole 152 is filled with the dielectric material by using the ALD method, the ALCVD method, or the CVD method, for example, and the dielectric film walls 16 are formed. In addition, the separation grooves 153 separating the sacrificial film layers 30 of the respective layers are filled with the dielectric material and the dielectric film walls 14 are formed. A material different from the material of the sacrificial film of the sacrificial film layer 30 is used as the dielectric material used for the dielectric film wall 16 and the dielectric film wall 14. For example, it is preferable to use $SiO_2$.

Figure 6A:
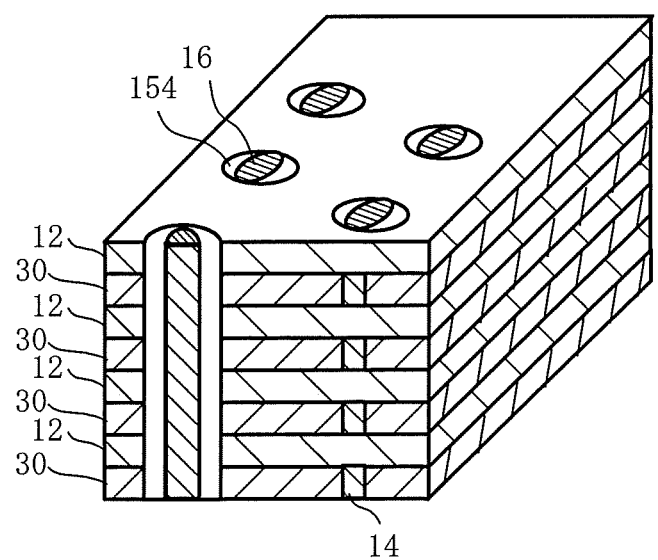
FIGS. 6A to 6C are perspective views showing another part of the steps of the method for fabricating the semiconductor device according to the first embodiment.
Figure 6B:
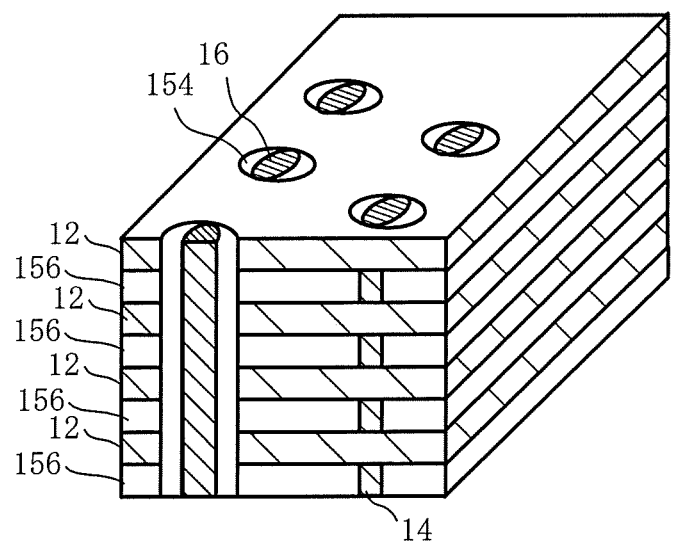
Figure 6C:
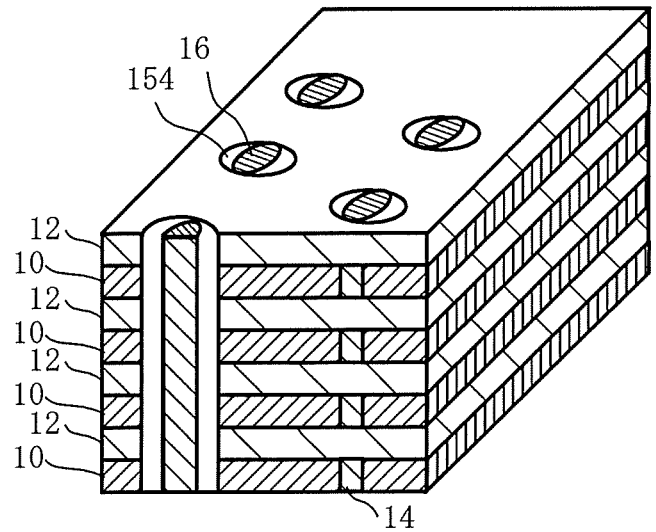

FIGS. 6A to 6C are perspective views showing another part of the steps of the method for fabricating the semiconductor device according to the first embodiment; FIGS. 6A to 6C show the sacrificial metal film etching step (S134) to the memory hole etching step (S138) in FIG. 3. The subsequent steps will be described later.

In FIG. 6A, as the sacrificial metal film etching step (S134), the sacrificial metal film 32 deposited in the two regions separated by the dielectric film wall 16 in the elliptic hole 152 is etched and removed by the wet etching method (for example, mixed acid treatment), for example. Thereby, two memory holes 154 (openings) separated by the dielectric film wall 16 can be formed in the elliptic hole 152.

In FIG. 6B, as the replacement step (S136), the sacrificial film layer 30 of each layer is removed by etching through the two memory holes 154 separated by the dielectric film wall 16 in the elliptic hole 152 and is replaced by a conductive material. Specifically, the sacrificial film layer 30 of each layer is removed by etching through the two memory holes 154 separated by the dielectric film wall 16 in the elliptic hole 152 by a wet etching method (for example, hot phosphoric acid treatment). Thereby, as shown in FIG. 6B, spaces 156 are formed between the dielectric layers 12 of the respective layers. Here, the dielectric film wall 16 extending in a direction orthogonal to the dielectric layer 12 of each layer becomes a pillar and can support the dielectric layer 12 of each layer so as not to collapse.

Next, a barrier metal film not shown in the drawings is first formed on the upper and lower wall surfaces and the sidewalls of the space 156 between the dielectric layers 12 of the respective layers through the two memory holes 154 separated by the dielectric film wall 16 by using the ALD method, the ALCVD method, or the CVD method. Then, a conductive material to be the wires 10 is filled into the space 156 between the dielectric layers 12 of the respective layers by using the ALD method, the ALCVD method, or the CVD method. As the barrier metal film, for example, titanium nitride (TiN) is preferably used. Further, as the conductive material to be the wire 10, tungsten (W) is preferably used. As a result, the plurality of wires 10 (10a, 10b, and 10c) separated by the dielectric film wall 14 can be formed in the conductive layer 50 shown in FIG. 1.

Here, in the replacement step (S136), the barrier metal film and the conductive material are also deposited on the sidewalls of the two memory holes 154 separated by the dielectric film wall 16 in the elliptic hole 152. Therefore, in FIG. 6C, as the memory hole etching step (S138), the barrier metal film and the conductive material deposited in the two memory holes 154 separated by the dielectric film wall 16 in the elliptic hole 152 are removed by etching.

Next, as the memory film formation step (S140), the memory films 20 and 22 are formed in the two memory holes 154 separated by the dielectric film wall 16 in each elliptic hole 152, respectively. The memory film 20 has a block dielectric film (first block dielectric film), a charge accumulation film (first charge accumulation film), and a tunnel dielectric film (first tunnel dielectric film). The memory film 22 has a block dielectric film (second block dielectric film), a charge accumulation film (second charge accumulation film), and a tunnel dielectric film (second tunnel dielectric film). Hereinafter, the internal step will be specifically described.

Figure 7:
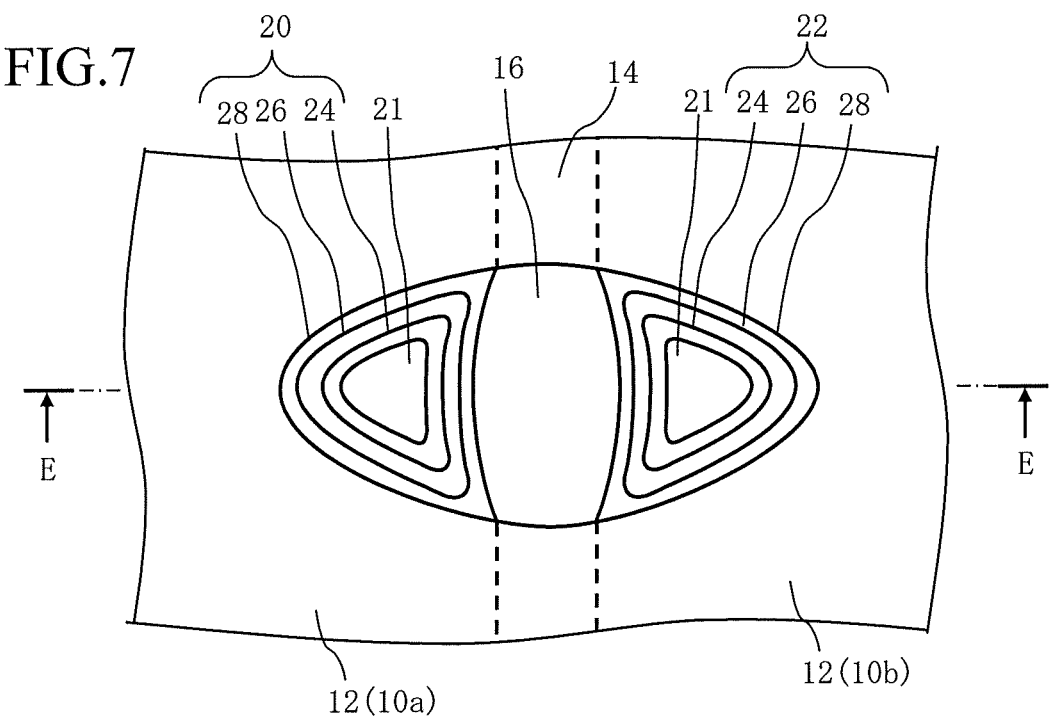
FIG. 7 is a top view showing an example of a configuration of a memory cell region in the first embodiment.
Figure 8:
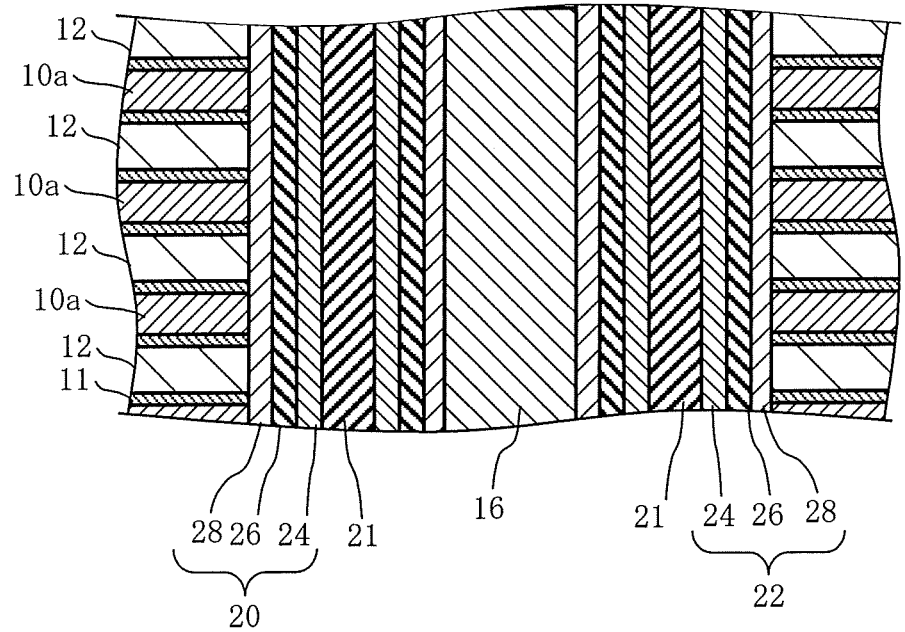
FIG. 8 is a cross-sectional view showing an example of the configuration of the memory cell region in the first embodiment.

FIG. 7 is a top view showing an example of a configuration of a memory cell region in the first embodiment. FIG. 8 is a cross-sectional view showing an example of the configuration of the memory cell region in the first embodiment. FIG. 8 shows a cross-section (E-E cross-section) viewed from the short diameter direction of the elliptic region of FIG. 7. It is to be noted that the scales are not matched in FIGS. 7 and 8.

As the block dielectric film formation step (S142), a block dielectric film 28 is formed along the sidewall surfaces of the two memory holes 154 by using the ALD method, the ALCVD method, or the CVD method, for example. The block dielectric film 28 is a film that suppresses the flow of charges between the charge accumulation film 26 and the wire 10. As a material of the block dielectric film 28, for example, it is preferable to use aluminum oxide ($Al_2O_3$). As a result, as a part of the memory film 20 (first memory film), the block dielectric film 28 (first block dielectric film) disposed in a tubular shape along the sidewall surface of one region of the elliptic cylinder region separated by the dielectric film wall 16 can be formed. Similarly, as a part of the memory film 22 (second memory film), the block dielectric film 28 (second block dielectric film) disposed in a tubular shape along the sidewall surface of the other region of the elliptic cylinder region separated by the dielectric film wall 16 can be formed. In other words, each of the memory films 20 and 22 includes an $Al_2O_3$ film functioning as the block dielectric film 28 disposed in a tubular shape to be continuous in the longitudinal direction of the elliptic cylinder region 60.

Here, as a method for replacing the sacrificial film layer 30 by a conductive material, there is a method for replacing the sacrificial film layer 30 by the conductive material from another replacement opening using the memory film and the channel film as a pillar supporting the dielectric layer 12 of each layer, after forming the memory film and the channel film. When the sacrificial film layer 30 is replaced by the conductive material from another replacement opening using the memory film and the channel film as the pillar supporting the dielectric layer 12 of each layer, after the memory film and the channel film are formed, the $Al_2O_3$ film has low resistance to, for example, phosphoric acid for etching the sacrificial film layer 30, so that the $Al_2O_3$ film may be removed at the same time by etching the sacrificial film layer 30. Therefore, according to this method, generally, when the memory film is formed, the remaining charge accumulation film 26 and tunnel dielectric film 24 are formed without forming the block dielectric film 28 and before depositing the barrier metal film and the conductive material after etching the sacrificial film layer 30, the $Al_2O_3$ film to be the block dielectric film 28 is formed through the replacement opening. Therefore, the $Al_2O_3$ film may be formed on the surface of the dielectric layer 12 of each stacked layer and the $Al_2O_3$ film may be sandwiched between the layers of the word lines. As a result, the capacity between the layers of the word lines of the respective layers tends to increase. On the other hand, in the first embodiment, since the sacrificial film layer 30 is replaced by the barrier metal film 11 and the word line by the wire 10 before forming the memory films 20 and 22, as shown in FIG. 8, the word line can be formed without sandwiching the $Al_2O_3$ film between the wire 10 of the conductive layer 50 of each layer and the dielectric layer 12. In other words, in the first embodiment, it is possible to obtain a structure in which the $Al_2O_3$ film is disposed as each of the block dielectric film 28 of the memory film 20 and the block dielectric film 28 of the memory film 22, without sandwiching the $Al_2O_3$ film between the conductive layer 50 of each layer of the plurality of layers of conductive layers 50 and the dielectric layer 12 of the corresponding layer of the plurality of layers of dielectric layers 12. In other words, the $Al_2O_3$ film can be disposed as the block dielectric film 28 without sandwiching the $Al_2O_3$ film between the layers of the word lines. Therefore, the capacity between the layers of the word lines can be decreased.

Next, as the charge accumulation film formation step (S144), the charge accumulation film 26 is formed along the sidewall surfaces of the block dielectric film 28 in the two memory holes 154 by using the ALD method, the ALCVD method, or the CVD method, for example. The charge accumulation film 26 is a film containing a material capable of accumulating charges. As the material of the charge accumulation film 26, for example, SiN is preferably used. As a result, the charge accumulation film 26 (first charge accumulation film) disposed in a tubular shape along the inner wall surface of the block dielectric film 28 can be formed as a part of the memory film 20 (first memory film). Similarly, the charge accumulation film 26 (second charge accumulation film) disposed in a tubular shape along the inner wall surface of the block dielectric film 28 can be formed as a part of the memory film 22 (second memory film).

Next, as the tunnel dielectric film formation step (S146), the tunnel dielectric film 24 is formed along the sidewall surfaces of the charge accumulation film 26 in the two memory holes 154 by using the ALD method, the ALCVD method, or the CVD method, for example. The tunnel dielectric film 24 is a dielectric film allowing a current to flow by applying a predetermined voltage, although it has an insulating property. As the material of the tunnel dielectric film 24, for example, $SiO_2$ is preferably used. As a result, the tunnel dielectric film 24 (first tunnel dielectric film) disposed in a tubular shape along the inner wall surface of the charge accumulation film 26 can be formed as a part of the memory film 20 (first memory film). Similarly, the tunnel dielectric film 24 (second tunnel dielectric film) disposed in a tubular shape along the inner wall surface of the charge accumulation film 26 can be formed as a part of the memory film 22 (second memory film).

Next, as the channel film formation step (S148), the channel film 21 is formed in a columnar shape along the entire circumference of the inner wall surface of the tunnel dielectric film 24 in the two memory holes 154 by using the ALD method, the ALCVD method, or the CVD method, for example. In other words, the channel film 21 is formed in a columnar shape along the inner wall surface of the memory film 20. Similarly, the channel film 21 is formed in a columnar shape along the inner wall surface of the memory film 22. In the examples of FIGS. 7 and 8, the channel film 21 is formed in a columnar shape along the entire circumference of the inner wall surface of the memory film 20. Similarly, the channel film 21 is formed in a columnar shape along the entire circumference of the inner wall surface of the memory film 22. As a material of the channel film 21, a semiconductor material is used. For example, it is preferable to use silicon (Si) doped with impurities. As a result, the channel film 21 (first channel film) can be formed in a columnar shape along the inner wall surface of the tunnel dielectric film 24 to be a part of the memory film 20 (first memory film). Similarly, the channel film 21 (second channel film) can be formed in a columnar shape along the inner wall surface of the tunnel dielectric film 24 to be a part of the memory film 22 (second memory film). In the columnar channel film 21, a tubular structure having a bottom portion may be formed using a semiconductor material and a core portion using a dielectric material may be disposed in an inner portion thereof.

As described above, as shown in FIG. 8, the semiconductor device according to the first embodiment including the memory cells having a MANOS structure using metal (M)-aluminum oxide (A)-nitride film (N)-oxide film (O)-silicon (S) can be formed.

In the example described above, the case where $Al_2O_3$ is used as the material of the block dielectric film 28 has been described. However, the present disclosure is not limited thereto. As the block dielectric film 28, in addition to the $Al_2O_3$ film, a $SiO_2$ film may be used. When the $SiO_2$ film is used as the block dielectric film 28, the memory cells having the MONOS structure using metal (M)-oxide film (O)-nitride film (N)-oxide film (O)-silicon (S) can be formed.

The first embodiment does not exclude the method for replacing the sacrificial film layer 30 by the conductive material from another replacement opening by using the memory films 20 and 22 and the channel film 21 as pillars for supporting the dielectric layer 12 of each layer. At this time, as the memory films 20 and 22 to be the pillars, the remaining charge accumulation film 26 and tunnel dielectric film 24 are formed without forming the block dielectric film 28 and before depositing the barrier metal film and the conductive material after etching the sacrificial film layer 30, the block dielectric film 28 may be formed through the replacement opening. In other words, before the barrier metal film and the conductive material are deposited after the sacrificial film layer 30 is etched, the block dielectric film 28 may be formed through the replacement opening. This method is particularly effective, for example, when the $SiO_2$ film is used as the block dielectric film 28.

As described above, according to the first embodiment, it is possible to form memory cells twice as many as existing memory cells in the three-dimensional NAND type flash memory device. Therefore, higher integration of the three-dimensional NAND type flash memory device can be achieved. Further, according to the first embodiment, since the memory films 20 and 22 are not physically divided by vertical division using the lithography technology, damage to the memory film structure can be suppressed. Further, according to the first embodiment, it is possible to reliably surround the periphery of the channel film 21 used for each of the doubled memory cells with the tubular memory films 20 and 22, so that sufficient memory performance can be exerted.

Second Embodiment

Figure 9:
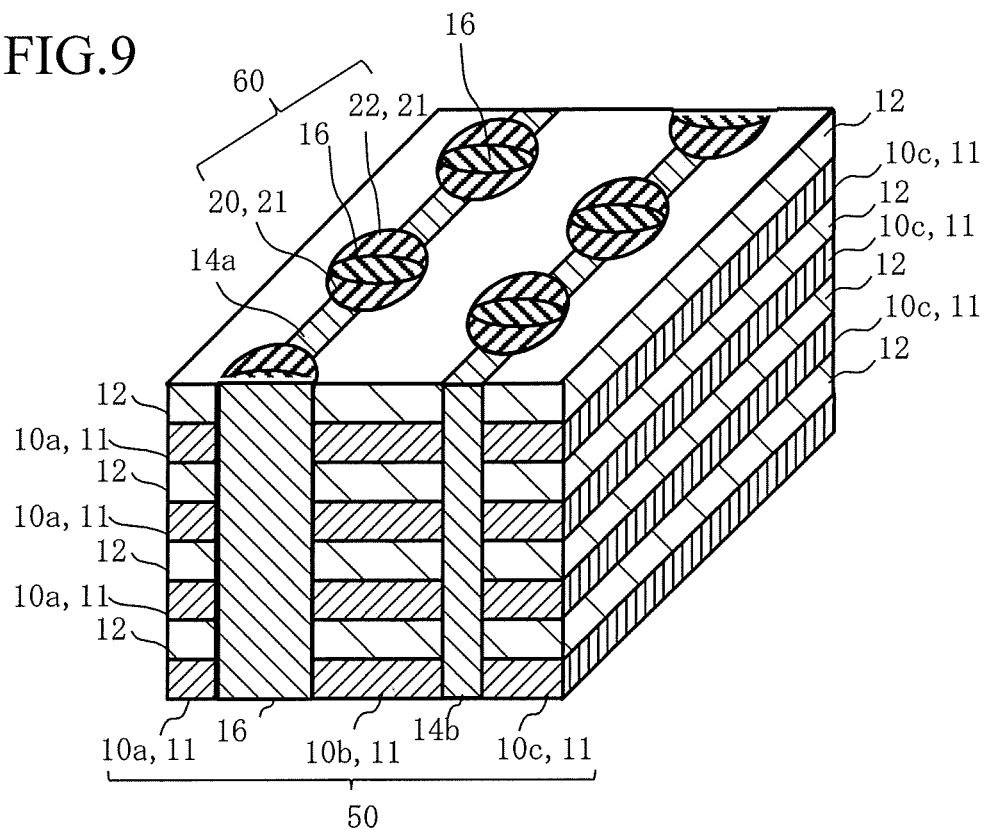
FIG. 9 is a perspective view showing an example of a configuration of a semiconductor device according to a second embodiment.
Figure 10:
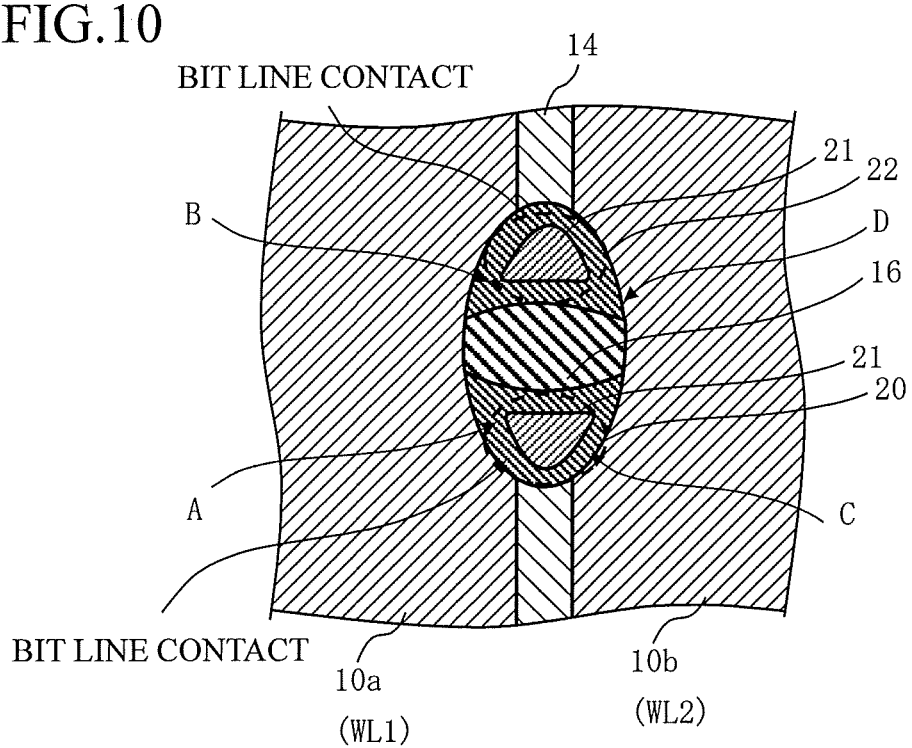
FIG. 10 is a top view showing an example of a configuration of a conductive layer and a memory cell of the semiconductor device according to the second embodiment.

FIG. 9 is a perspective view showing an example of a configuration of a semiconductor device according to a second embodiment. FIG. 10 is a top view showing an example of a configuration of a conductive layer and a memory cell of the semiconductor device according to the second embodiment. It is to be noted that the scales are not matched in FIGS. 9 and 10. In the examples of FIGS. 9 and 10, an example of a configuration of a memory element region in a semiconductor storage device to be an example of a semiconductor device is shown. In FIG. 9, a channel film 21 and a barrier metal film 11 are denoted only by reference numerals and illustration thereof is omitted. In FIG. 9, the semiconductor device according to the second embodiment has a plurality of layers of conductive layers 50 in which a plurality of wires 10a, 10b, and 10c to be word lines (WL) in the semiconductor storage device are formed in parallel, similar to FIG. 1. Further, the semiconductor device according to the second embodiment has a plurality of layers of dielectric layers 12 that insulate the conductive layers 50 adjacent to each other. The conductive layer 50 of each layer of the plurality of layers of conductive layers 50 and the dielectric layer 12 of each layer of the plurality of layers of dielectric layers 12 are alternately stacked. A stacked body of the plurality of layers of conductive layers 50 and the plurality of layers of dielectric layers 12 is separated by a dielectric film wall 14a (second dielectric film wall). As a result, the plurality of wires 10a, 10b, and 10c separated by the dielectric film wall 14a (second dielectric film wall) are disposed in the conductive layer 50 of each layer. In other words, a group (first wire group) of the plurality of layers of wires 10a and a group (second wire group) of the plurality of layers of wires 10b are separated by the dielectric film wall 14a (second dielectric film wall). Similarly, a group of the plurality of layers of wires 10b and a group of the plurality of layers of wires 10c are separated by the dielectric film wall 14b. In the conductive layer 50 of each layer, the wire 10a (WL1: an example of a first wire) is formed at the same position. Similarly, in the conductive layer 50 of each layer, the wire 10b (WL2: an example of a second wire) is formed at the same position. Similarly, in the conductive layer 50 of each layer, the wire 10c is formed at the same position. The plurality of wires 10a, 10b, and 10c are plate-like wires using the same conductive material.

A plurality of elliptic cylinder regions 60 are disposed in a row in portions where the wires 10a and the wires 10b face each other with the dielectric film wall 14a therebetween. Further, a plurality of elliptic cylinder regions 60 are disposed in a row in portions where the wires 10b and the wires 10c face each other with the dielectric film wall 14b therebetween. Each elliptic cylinder region 60 penetrates a stacked body of the plurality of layers of conductive layers 50 and the plurality of layers of dielectric layers 12 in a direction orthogonal to a stacked surface. The plurality of elliptic cylinder regions 60 in adjacent rows are disposed in a zigzag shape in plan view, for example. In each elliptic cylinder region 60, two memory films 20 and 22 are disposed. The memory film 20 (first memory film) is disposed in one of two regions obtained by separating the one elliptic cylinder region 60 in a long diameter direction of an ellipse by a dielectric film wall 16 (first dielectric film wall). The memory film 22 (second memory film) is disposed in the other of the two regions obtained by separating the one elliptic cylinder region 60 in the long diameter direction of the ellipse by the dielectric film wall 16 (first dielectric film wall). As such, the dielectric film wall 16 separates each elliptic cylinder region 60 into the two regions in the long diameter direction of the ellipse. The channel film 21 (first channel film) is disposed in a columnar shape along the entire circumference of an inner wall surface of the memory film 20 over one side and the other side in the short diameter direction of the ellipse in the elliptic cylinder region 60. Similarly, the channel film 21 (second channel film) is disposed in a columnar shape along the entire circumference of an inner wall surface of the memory film 22 over one side and the other side in the short diameter direction of the ellipse in the elliptic cylinder region 60. In other words, the dielectric film wall 16, the memory films 20 and 22, and the channel films 21 inside the memory films 20 and 22 are disposed in each elliptic cylinder region 60. Thus, in the examples of FIGS. 9 and 10, a plurality of elliptic cylinder regions 60 each of which is provided with the dielectric film wall 16, the memory films 20 and 22, and the channel films 21 inside the memory films 20 and 22, and a plurality of portions where the plurality of layers of the wires 10a (first wire groups) and the plurality of layers of the wires 10b (second wire groups) face each other with the dielectric film wall 14 therebetween, are alternately arranged one by one in the long diameter direction of the ellipse of the elliptic cylinder region 60. In the examples of FIGS. 9 and 10, unlike the first embodiment, a long diameter direction of the ellipse of each elliptic cylinder region 60 is disposed substantially parallel to an extension direction of each wire 10. Therefore, in the examples of FIGS. 9 and 10, unlike the first embodiment, the dielectric film wall 14a separating the wire 10a and the wire 10b of the conductive layer 50 of each layer does not contact the dielectric film wall 16 of the elliptic cylinder region 60 located at the portion where the wire 10a and the wire 10b face each other and is formed as a separated body. In other word, the dielectric film wall 16 is contactlessly disposed with the dielectric film wall 14a, and a direction of a wall surface of the dielectric film wall 16 is oriented in a different direction with a direction of a wall surface of the dielectric film wall 14a. Similarly, the dielectric film wall 14b separating the wire 10b and the wire 10c of the conductive layer 50 of each layer does not contact the dielectric film wall 16 of the elliptic cylinder region 60 located at the portion where the wire 10b and the wire 10c face each other and is formed as a separated body.

As shown in FIGS. 9 and 10, the groups of wires 10a of the plurality of layers of conductive layers 50 are provided in a plurality of layers in a longitudinal direction of the elliptic cylinder region 60 located at the portion where the wires 10a and the wires 10b face each other with the dielectric film wall 14a therebetween. Each group of wires 10a has a plate shape and extends in a direction orthogonal to the longitudinal direction of the column of the elliptic cylinder region 60. In the examples of FIGS. 9 and 10, the groups of wires 10a of the plurality of layers of conductive layers 50 extend in the long diameter direction of the ellipse of the elliptic cylinder region 60. The group of wires 10a is connected to a part (A portion) of the memory film 20 and a part (B portion) of the memory film 22 in each elliptic cylinder region 60, on one side of the short diameter direction of the ellipse in each elliptic cylinder region 60 located at the portion where the wire 10a and the wire 10b face each other with the dielectric film wall 14a therebetween. The groups of wires 10b of the plurality of layers of conductive layers 50 are provided in a plurality of layers in the same layers as the groups of wires 10a. Each group of wires 10b has a plate shape, is parallel to the group of wires 10a, and extends in a direction orthogonal to the longitudinal direction of the column of the elliptic cylinder region 60 located at the portion where the wire 10a and the wire 10b face each other with the dielectric film wall 14a therebetween. In the examples of FIGS. 9 and 10, the group of wires 10b of the plurality of layers of conductive layers 50 extends in the long diameter direction of the ellipse of the elliptic cylinder region 60. The group of wires 10b is connected to the other part (C portion) of the memory film 20 and the other part (D portion) of the memory film 22 in each elliptic cylinder region 60, on the other side of the short diameter direction of the ellipse in each elliptic cylinder region 60 located at the portion where the wire 10a and the wire 10b face each other with the dielectric film wall 14a therebetween.

The group of wires 10*b* of the conductive layer 50 of each layer extends in a direction orthogonal to the longitudinal direction of the column of the elliptic cylinder region 60 located at the portion where the wire 10*b* and the wire 10*c* face each other with the dielectric film wall 14*b* therebetween. The group of wires 10*b* is also connected to a part of the memory film 20 and a part of the memory film 22 in the elliptic cylinder region 60 located at the portion where the wire 10*b* and the wire 10*c* face each other with the dielectric film wall 14*b* therebetween. The groups of wires 10*c* of the plurality of layers of conductive layers 50 are provided in a plurality of layers in the same layers as the groups of wires 10*a* and 10*b*. Each group of wires 10*c* has a plate shape, is parallel to the groups of wires 10*a* and 10*b*, and extends in a direction orthogonal to the longitudinal direction of the column of the elliptic cylinder region 60 located at the portion where the wire 10*b* and the wire 10*c* face each other with the dielectric film wall 14*b* therebetween. The group of wires 10*c* is connected to the other part of the memory film 20 and the other part of the memory film 22 in the elliptic cylinder region 60 located at the portion where the wire 10*b* and the wire 10*c* face each other with the dielectric film wall 14*b* therebetween.

In the conductive layer 50 of each layer, the combination of the wire 10*a* to be a word line, the memory film 20 of one elliptic cylinder region 60 located at the portion where the wire 10*a* and the wire 10*b* face each other with the dielectric film wall 14*a* therebetween, and the channel film 21 surrounded by the memory film 20 constitute one memory cell. One NAND string is constituted by a plurality of memory cells in which the memory cells formed in each of the plurality of layers of conductive layers 50 to be connected to the memory film 20 of the same elliptic cylinder region 60 are connected by the channel film 21 of the same elliptic cylinder region 60.

In the conductive layer 50 of each layer, the combination of the wire 10*b* to be a word line, the memory film 20 of one elliptic cylinder region 60 located at the portion where the wire 10*a* and the wire 10*b* face each other with the dielectric film wall 14*a* therebetween, and the channel film 21 surrounded by the memory film 20 also constitute one memory cell. One NAND string is constituted by a plurality of memory cells in which the memory cells formed in each of the plurality of layers of conductive layers 50 to be connected to the memory film 20 of the same elliptic cylinder region 60 are connected by the channel film 21 of the same elliptic cylinder region 60.

Similarly, in the conductive layer 50 of each layer, the combination of the wire 10*a* to be a word line, the memory film 22 of one elliptic cylinder region 60 located at the portion where the wire 10*a* and the wire 10*b* face each other with the dielectric film wall 14*a* therebetween, and the channel film 21 surrounded by the memory film 22 constitute one memory cell. One NAND string is constituted by a plurality of memory cells in which the memory cells formed in each of the plurality of layers of conductive layers 50 to be connected to the memory film 22 of the same elliptic cylinder region 60 are connected by the channel film 21 of the same elliptic cylinder region 60.

In the conductive layer 50 of each layer, the combination of the wire 10*b* to be a word line, the memory film 22 of one elliptic cylinder region 60 located at the portion where the wire 10*a* and the wire 10*b* face each other with the dielectric film wall 14*a* therebetween, and the channel film 21 surrounded by the memory film 22 also constitute one memory cell. One NAND string is constituted by a plurality of memory cells in which the memory cells formed in each of the plurality of layers of conductive layers 50 to be connected to the memory film 22 of the same elliptic cylinder region 60 are connected by the channel film 21 of the same elliptic cylinder region 60.

In the conductive layer 50 of each layer, the combination of the wire 10*b* to be a word line, the memory film 20 of one elliptic cylinder region 60 located at the portion where the wire 10*b* and the wire 10*c* face each other with the dielectric film wall 14*b* therebetween, and the channel film 21 surrounded by the memory film 20 constitute one memory cell. One NAND string is constituted by a plurality of memory cells in which the memory cells formed in each of the plurality of layers of conductive layers 50 to be connected to the memory film 20 of the same elliptic cylinder region 60 are connected by the channel film 21 of the same elliptic cylinder region 60.

In the conductive layer 50 of each layer, the combination of the wire 10*c* to be a word line, the memory film 20 of one elliptic cylinder region 60 located at the portion where the wire 10*b* and the wire 10*c* face each other with the dielectric film wall 14*b* therebetween, and the channel film 21 surrounded by the memory film 20 also constitute one memory cell. One NAND string is constituted by a plurality of memory cells in which the memory cells formed in each of the plurality of layers of conductive layers 50 to be connected to the memory film 20 of the same elliptic cylinder region 60 are connected by the channel film 21 of the same elliptic cylinder region 60.

Similarly, in the conductive layer 50 of each layer, the combination of the wire 10*b* to be a word line and the memory film 22 of one elliptic cylinder region 60 located at the portion where the wire 10*b* and the wire 10*c* face each other with the dielectric film wall 14*b* therebetween, and the channel film 21 surrounded by the memory film 22 constitute one memory cell. One NAND string is constituted by a plurality of memory cells in which the memory cells formed in each of the plurality of layers of conductive layers 50 to be connected to the memory film 22 of the same elliptic cylinder region 60 are connected by the channel film 21 of the same elliptic cylinder region 60.

In the conductive layer 50 of each layer, the combination of the wire 10*c* to be a word line, the memory film 22 of one elliptic cylinder region 60 located at the portion where the wire 10*b* and the wire 10*c* face each other with the dielectric film wall 14*b* therebetween, and the channel film 21 surrounded by the memory film 22 constitute one memory cell. One NAND string is constituted by a plurality of memory cells in which the memory cells formed in each of the plurality of layers of conductive layers 50 to be connected to the memory film 22 of the same elliptic cylinder region 60 are connected by the channel film 21 of the same elliptic cylinder region 60.

One end of a pair of NAND strings using the memory film 20 of the same elliptic cylinder region 60 connected by two word lines in the conductive layer 50 of each layer is connected to one bit line contact and the other end thereof is connected to one source line. Further, one end of a pair of NAND strings using the memory film 22 of the same elliptic cylinder region 60 connected by two word lines in the conductive layer 50 of each layer is connected to another bit line contact and the other end thereof is connected to one source line.

As described above, in the second embodiment, instead of forming one memory cell by a combination of one memory film and one channel film, memory cells by two combinations including a combination of the memory film 20 and the channel film 21 and a combination of the memory film 22 and the channel film 21 are formed in the same elliptic cylinder region 60. In each conductive layer 50, four memory cells (A, B, C, and D portions) are formed by two combinations for each of the same elliptic cylinder regions 60. As a result, the density of the memory cells can be further increased as compared with the first embodiment. Therefore, higher integration can be achieved in the three-dimensional NAND type flash memory device.

Figure 11:
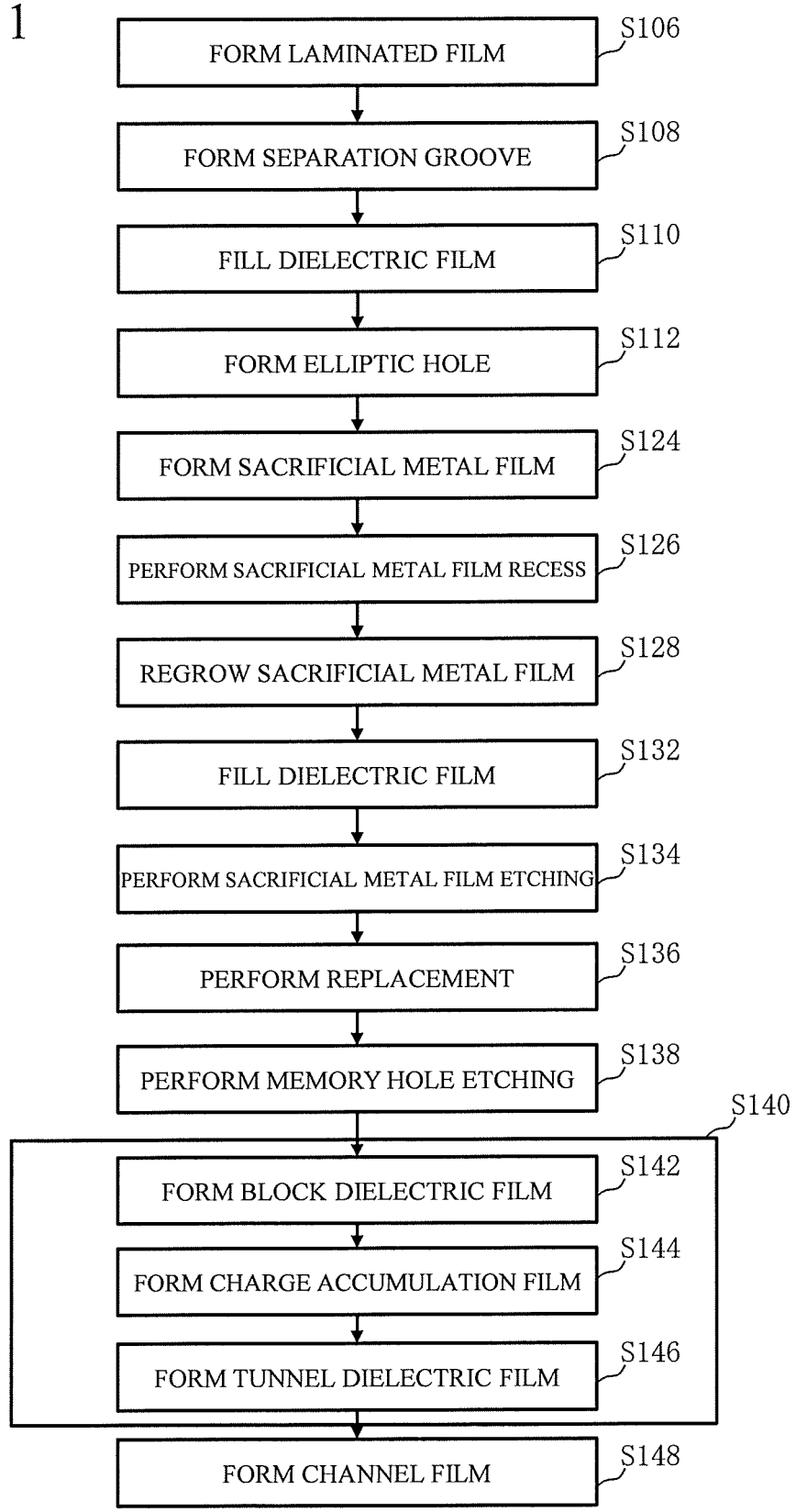
FIG. 11 is a flowchart showing main steps of a method for fabricating the semiconductor device according to the second embodiment.

FIG. 11 is a flowchart showing main steps of a method for fabricating the semiconductor device according to the second embodiment. FIG. 11 is the same as FIG. 3, except that, in the method for fabricating the semiconductor device according to the second embodiment, a separation groove formation step (S108) and a dielectric film filling step (S110) are executed between a stacked film formation step (S106) and an elliptic hole formation step (S112) and a separation groove formation step (S130) is removed. Therefore, in FIG. 11, in a method for fabricating the semiconductor device according to the second embodiment, a series of steps including the stacked film formation step (S106), the separation groove formation step (S108), the dielectric film filling step (S110), the elliptic hole formation step (S112), a sacrificial metal film formation step (S124), a sacrificial metal film recess step (S126), a sacrificial metal film regrowth step (S128), a dielectric film formation step (S132), a sacrificial metal film etching step (S134), a replacement step (S136), a memory hole etching step (S138), a memory film formation step (S140), and a channel film formation step (S148) is executed. In the memory film formation step (S140), a series of steps including a block dielectric film formation step (S142), a charge accumulation film formation step (S144), and a tunnel dielectric film formation step (S146) is executed as internal steps.

Figure 12A:
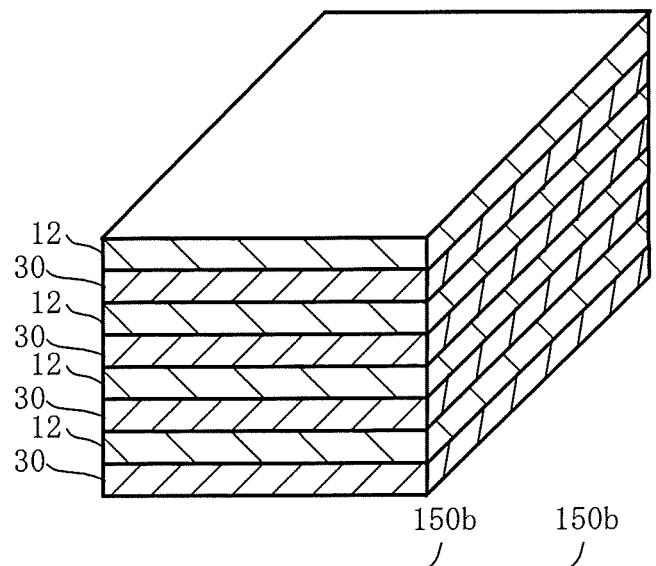
FIGS. 12A to 12C are perspective views showing a part of the steps of the method for fabricating the semiconductor device according to the second embodiment.
Figure 12B:
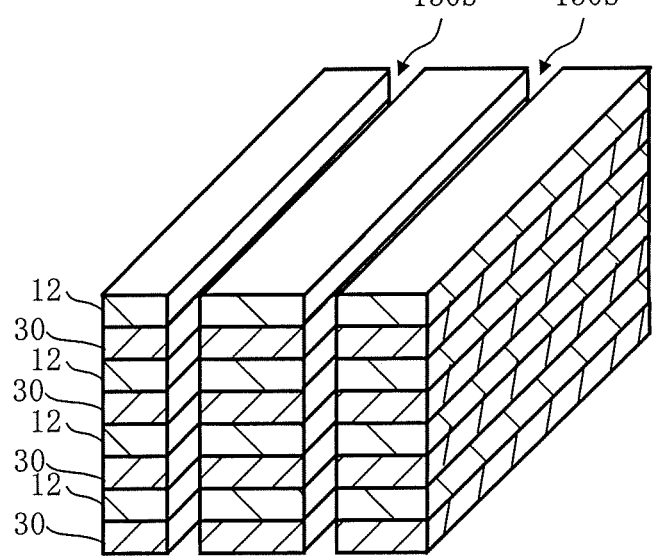
Figure 12C:
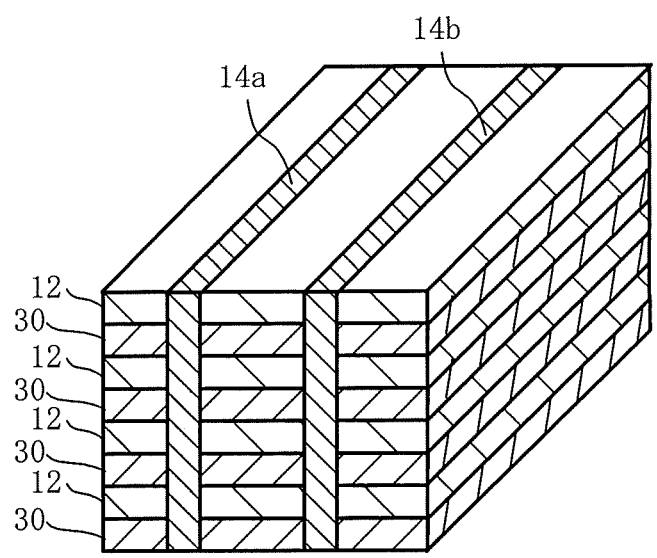

FIGS. 12A to 12C are perspective views showing a part of the steps of the method for fabricating the semiconductor device according to the second embodiment. FIGS. 12A to 12C show the stacked film formation step (S106) to the dielectric film filling step (S110) in FIG. 11. The subsequent steps will be described later.

In FIG. 12A, as the stacked film formation step (S106), a sacrificial film layer 30 and a dielectric layer 12 are alternately stacked on a semiconductor substrate not shown in the drawings by using an ALD method, an ALCVD method, or a CVD method, for example. The contents of the stacked film formation step (S106) are the same as those of the first embodiment.

In FIG. 12B, as the separation groove formation step (S108), separation grooves 150a and 150b for separating a region are formed in a stacked film of the sacrificial film layer 30 and the dielectric layer 12. The separation grooves 150a and 150b are formed at positions separating a plurality of word lines 10 of each layer shown in FIG. 9 so as to penetrate the stacked film. In a state in which a resist film is formed on the dielectric layer 12 through a lithography step such as a resist coating step and an exposing step not shown in the drawings, the exposed dielectric layer 12 and a stacked film of the sacrificial film layer 30 and the dielectric layer 12 located below the exposed dielectric layer 12 are removed by an anisotropic etching method. As a result, the separation grooves 150a and 150b can be formed substantially perpendicularly to a surface of the dielectric layer 12. For example, the separation grooves 150a and 150b may be formed by an RIE method.

In FIG. 12C, as the dielectric film filling step (S110), the dielectric film walls 14 (14a and 14b) are formed by filling each of the separation grooves 150a and 150b with a dielectric material by using the ALD method, the ALCVD method, or the CVD method, for example. A material different from a material of a sacrificial film of the sacrificial film layer 30 is used as the dielectric material used for the dielectric film wall 14. For example, it is preferable to use $SiO_2$.

Figure 13A:
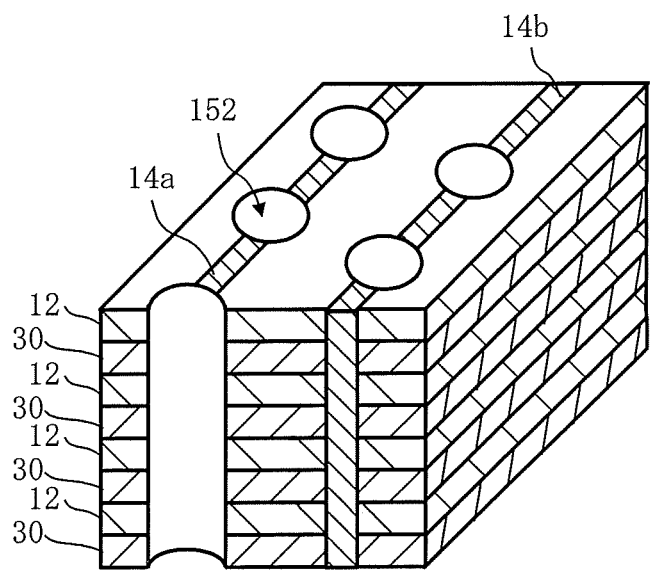
FIGS. 13A to 13C are perspective views showing another part of the steps of the method for fabricating the semiconductor device according to the second embodiment.
Figure 13B:
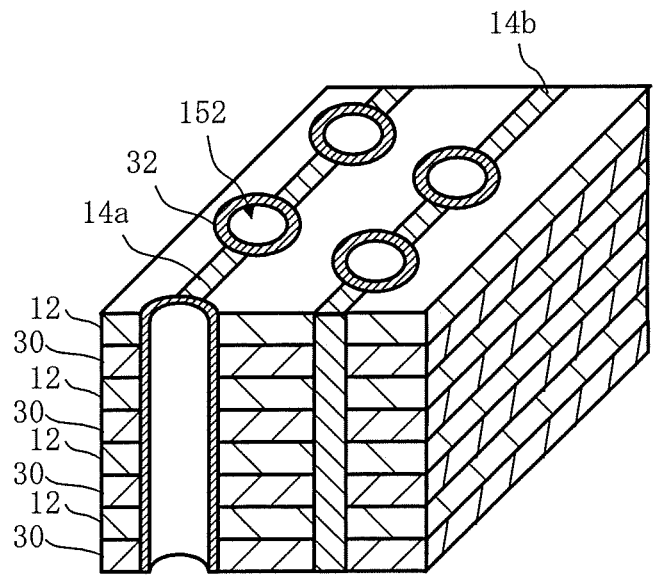
Figure 13C:
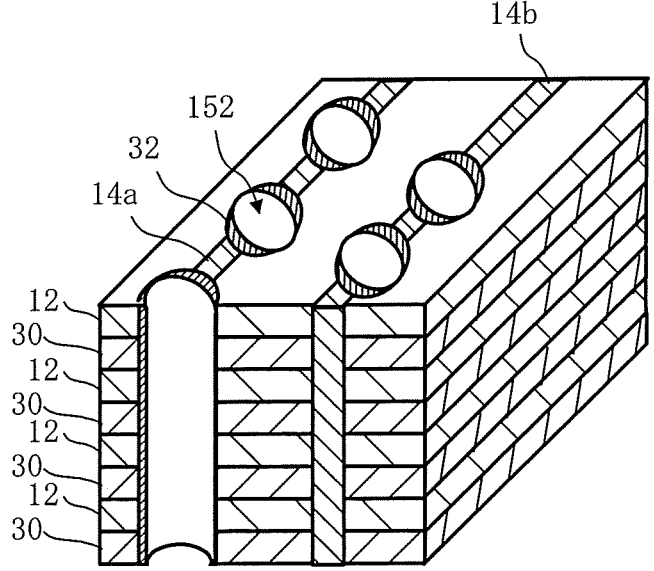

FIGS. 13A to 13C are perspective views showing another part of the steps of the method for fabricating the semiconductor device according to the second embodiment. FIGS. 13A to 13C show the elliptic hole formation step (S112) to the sacrificial metal film recess step (S126) in FIG. 11. The subsequent steps will be described later.

In FIG. 13A, as the elliptic hole formation step (S112), an elliptic opening (elliptic hole 152) penetrating the stacked film from the dielectric layer 12 is formed. Here, a plurality of elliptic holes 152 are formed along a longitudinal direction of the wires 10 at positions on the dielectric film walls 14 between the adjacent wires 10 to be the word lines shown in FIG. 9. In a state in which a resist film is formed on the dielectric layer 12 through a lithography step such as a resist coating step and an exposing step not shown in the drawings, the exposed dielectric layer 12, a stacked film of the sacrificial film layer 30 and the dielectric layer 12 located below the exposed dielectric layer 12, and the dielectric film wall 14 are removed by an anisotropic etching method. As a result, the elliptic hole 152 can be formed substantially perpendicularly to a surface of the dielectric layer 12. For example, the elliptic hole 152 may be formed by the RIE method. Here, each elliptic hole 152 is preferably formed so that the long diameter direction is oriented in the longitudinal direction of the wire 10 to be the word line shown in FIGS. 9 and 10, unlike the first embodiment. In addition, each elliptic hole 152 is not limited to a complete elliptic shape. Each elliptic hole 152 may have a shape which has a long diameter and a short diameter and in which a curvature of a side portion in a long diameter direction is larger than a curvature of a side portion in a short diameter direction. For example, each elliptic hole 152 may have the oval shape or the like.

In FIG. 13B, as the sacrificial metal film formation step (S124), the sacrificial metal film 32 is formed in the elliptic hole 152 by using the ALD method, the ALCVD method, or the CVD method, for example. The contents of the sacrificial metal film formation step (S124) may be the same as those of the first embodiment.

In FIG. 13C, as the sacrificial metal film recess step (S126), a recess shape is formed in the sacrificial metal film 32 by etching the sacrificial metal film 32 in the elliptic hole 152 by a wet etching method (for example, mixed acid treatment), for example. The contents of the sacrificial metal film recess step (S126) may be the same as those of the first embodiment. Although the orientation of the ellipse is different from that of the first embodiment, the second embodiment is the same as the first embodiment in that the recess shape of the sacrificial metal film 32 is formed so that the sacrificial metal film 32 of the sidewall portion of the short diameter direction having a small curvature is removed and the sacrificial metal film 32 remains on the sidewall portion of the long diameter direction having a large curvature.

Figure 14A:
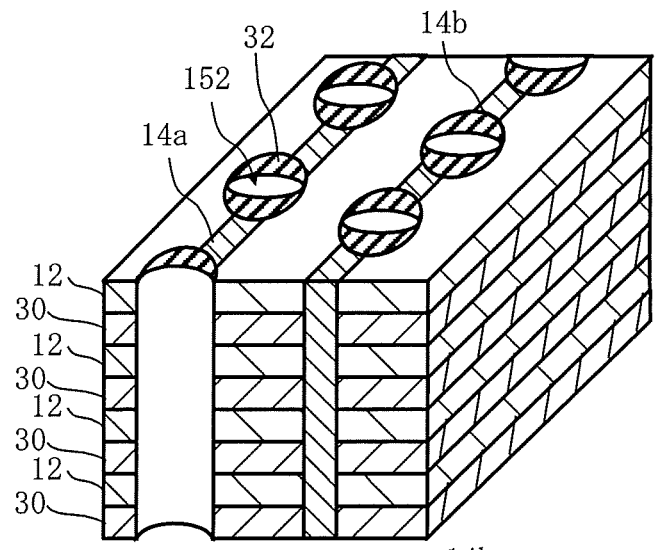
FIGS. 14A to 14C are perspective views showing another part of the steps of the method for fabricating the semiconductor device according to the second embodiment.
Figure 14B:
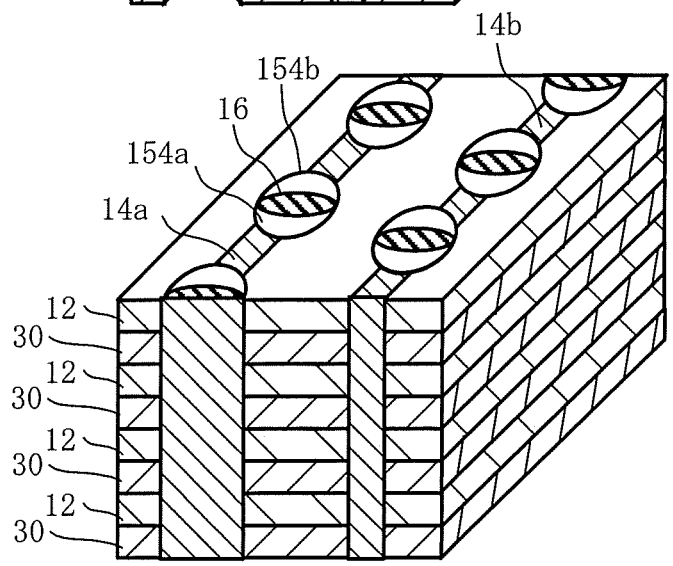
Figure 14C:
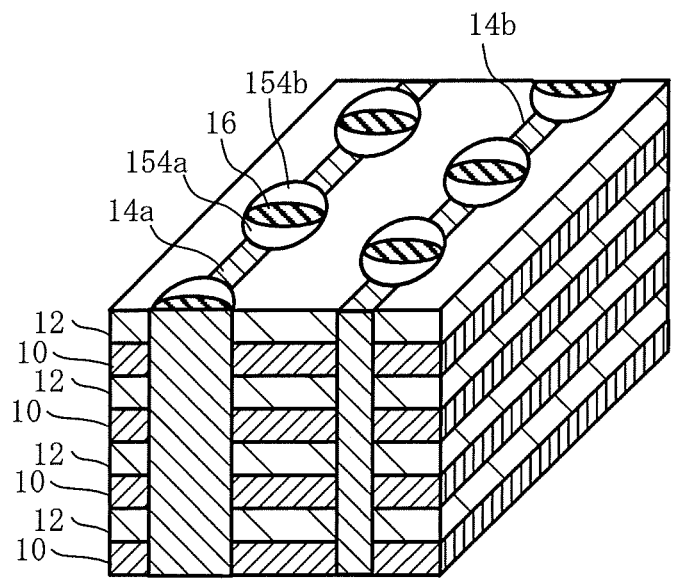

FIGS. 14A to 14C are perspective views showing another part of the steps of the method for fabricating the semiconductor device according to the second embodiment. FIGS. 14A to 14C show the sacrificial metal film regrowth step (S128) to the replacement step (S136) in FIG. 11. The subsequent steps will be described later.

In FIG. 14A, as the sacrificial metal film regrowth step (S128), the sacrificial metal film 32 having the recess shape in the elliptic hole 152 is regrown by using the ALD method, the ALCVD method, or the CVD method, for example. The contents of the sacrificial metal film regrowth step (S128) may be the same as those of the first embodiment. As a result, two regions in the elliptic hole 152 separated by the space between both the sidewall portions in the short diameter direction can be filled with the sacrificial metal film 32, in a state where the sacrificial metal film 32 does not exist in both the sidewall portions in the short diameter direction and the space between both the sidewall portions.

In FIG. 14B, as the dielectric film formation step (S132), the dielectric film wall 16 is formed by filling the space between both the sidewall portions of the short diameter direction in each elliptic hole 152 with a dielectric material by using the ALD method, the ALCVD method, or the CVD method, for example. A material different from a material of a sacrificial film of the sacrificial film layer 30 is used as the dielectric material used for the dielectric film wall 16. For example, it is preferable to use $SiO_2$. Unlike the first embodiment, since the dielectric film wall 14 has already been formed, only the dielectric film wall 16 may be formed here. Since the orientation of the ellipse is different from that of the first embodiment, the dielectric film wall 16 does not contact the dielectric film wall 14. However, it goes without saying that the dielectric film wall 16 contacts the dielectric layer 12 of each layer of the stacked film.

Next, as the sacrificial metal film etching step (S134), the sacrificial metal film 32 separated in the two regions by the dielectric film wall 16 in the elliptic hole 152 and deposited in the elliptic hole 152 is etched and removed by the wet etching method (for example, mixed acid treatment), for example. As a result, the two memory holes 154a and 154b separated by the dielectric film wall 16 are formed in the elliptic hole 152.

In FIG. 14C, as the replacement step (S136), the sacrificial film layer 30 of each layer is removed by etching through the two memory holes 154 separated by the dielectric film wall 16 in the elliptic hole 152 and is replaced by a conductive material. Specifically, the sacrificial film layer 30 of each layer is removed by etching through the two memory holes 154 separated by the dielectric film wall 16 in the elliptic hole 152 by a wet etching method (for example, hot phosphoric acid treatment). As a result, a space is formed between the dielectric layers 12 of the respective layers. Here, the dielectric film wall 14 and the dielectric film wall 16 extending in a direction orthogonal to the dielectric layer 12 of each layer become pillars and can support the dielectric layer 12 of each layer so as not to collapse.

Next, a barrier metal film not shown in the drawings is first formed on the upper and lower wall surfaces and the sidewalls of the space between the dielectric layers 12 of the respective layers through the two memory holes 154 separated by the dielectric film wall 16 by using the ALD method, the ALCVD method, or the CVD method, for example. Then, a conductive material to be the wires 10 is filled into the space between the dielectric layers 12 of the respective layers through the two memory holes 154 separated by the dielectric film wall 16 by using the ALD method, the ALCVD method, or the CVD method. As the barrier metal film, for example, TiN is preferably used. Further, W is preferably used as the conductive material to be the wire 10. By this step, the plurality of wires 10 (10a, 10b, and 10c) separated by the dielectric film wall 14 can be formed in the conductive layer 50 shown in FIG. 9.

The contents of the memory hole etching step (S138), the memory film formation step (S140) (the block dielectric film formation step (S142), the charge accumulation film formation step (S144), the tunnel dielectric film formation step (S146)), and the channel film formation step (S148) are the same as those of the first embodiment.

Figure 15:
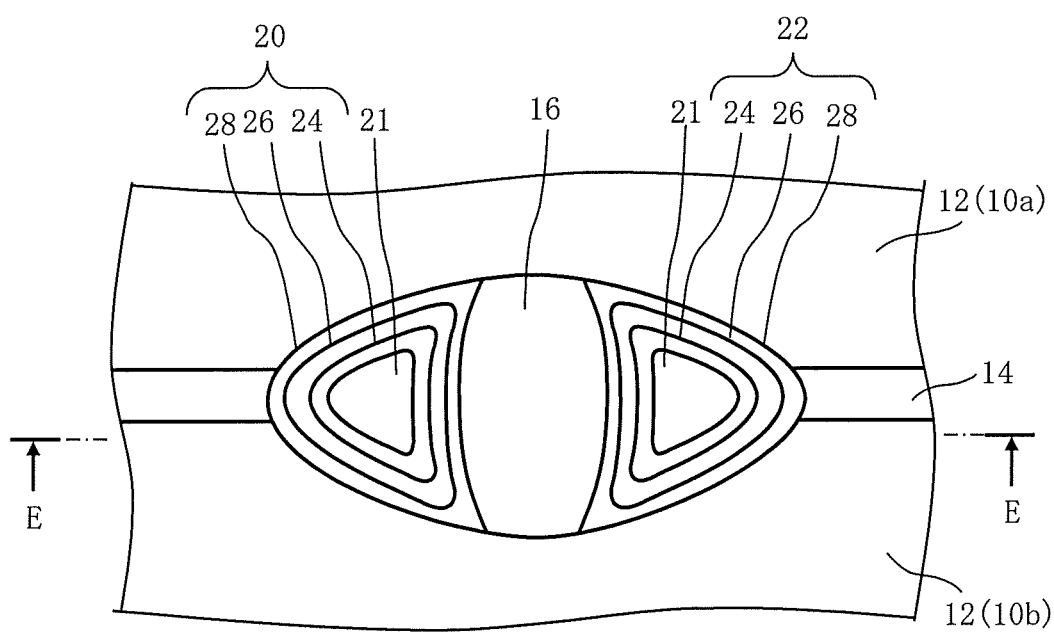
FIG. 15 is a top view showing an example of a configuration of a memory cell region in the second embodiment.

FIG. 15 is a top view showing an example of a configuration of a memory cell region in the second embodiment. A cross-section (E-E cross-section) of the elliptic region viewed from the short diameter direction at the position excluding the dielectric film wall 14 of FIG. 15 in the short diameter direction is the same as that in FIG. 8. In the second embodiment, for example, the memory films 20 and 22 and the channel film 21 are formed using the same material as that in the first embodiment. As a result, specifically, as shown in FIG. 15, the block dielectric film 28 (first block dielectric film) disposed in a tubular shape along the sidewall surface of one region of the elliptic cylinder region separated by the dielectric film wall 16 can be formed as a part of the memory film 20 (first memory film). Similarly, as a part of the memory film 22 (second memory film), the block dielectric film 28 (second block dielectric film) disposed in a tubular shape along the sidewall surface of the other region of the elliptic cylinder region separated by the dielectric film wall 16 can be formed. Further, a charge accumulation film 26 (first charge accumulation film) disposed in a tubular shape along the inner wall surface of the block dielectric film 28 can be formed as a part of the memory film 20 (first memory film). Similarly, the charge accumulation film 26 (second charge accumulation film) disposed in a tubular shape along the inner wall surface of the block dielectric film 28 can be formed as a part of the memory film 22 (second memory film). Further, the tunnel dielectric film 24 (first tunnel dielectric film) disposed in a tubular shape along the inner wall surface of the charge accumulation film 26 can be formed as a part of the memory film 20 (first memory film). Similarly, the tunnel dielectric film 24 (second tunnel dielectric film) disposed in a tubular shape along the inner wall surface of the charge accumulation film 26 can be formed as a part of the memory film 22 (second memory film). Further, the channel film 21 (first channel film) can be formed in a columnar shape along the inner wall surface of the tunnel dielectric film 24. Similarly, the channel film 21 (second channel film) can be formed in a columnar shape along the inner wall surface of the tunnel dielectric film 24. In the example of FIG. 15, the channel film 21 is formed in a columnar shape along the entire circumference of the inner wall surface of the memory film 20. Similarly, the channel film 21 is formed in a columnar shape along the entire circumference of the inner wall surface of the memory film 22. In the columnar channel film 21, a tubular structure having a bottom portion may be formed using a semiconductor material and a core portion using a dielectric material may be disposed in an inner portion thereof.

Here, when an $Al_2O_3$ film is used as the block dielectric film 28, similar to the first embodiment, in the second embodiment, the sacrificial film layer 30 is replaced with the barrier metal film 11 and the word line by the wire 10 before forming the memory films 20 and 22. Therefore, the word line can be formed without sandwiching the $Al_2O_3$ film between the wire 10 of the conductive layer 50 of each layer and the dielectric layer 12. In other words, similar to the first embodiment, in the second embodiment, it is possible to obtain a structure in which the $Al_2O_3$ film is disposed as each of the block dielectric film 28 of the memory film 20 and the block dielectric film 28 of the memory film 22, without sandwiching the $Al_2O_3$ film between the conductive layer 50 of each layer of the plurality of layers of conductive layers 50 and the dielectric layer 12 of the corresponding layer of the plurality of layers of dielectric layers 12. In other words, the Al$_2$O$_3$ film can be disposed as the block dielectric film 28 without sandwiching the Al$_2$O$_3$ film between the layers of the word lines. Therefore, the capacity between the layers of the word lines can be decreased.

As described above, as shown in FIG. 8, the semiconductor device according to the second embodiment including memory cells having a MANOS structure using metal (M)-aluminum oxide (A)-nitride film (N)-oxide film (O)-silicon (S) can be formed.

In the example described above, the case where Al$_2$O$_3$ is used as the material of the block dielectric film 28 has been described. However, the present disclosure is not limited thereto. As the block dielectric film 28, in addition to the Al$_2$O$_3$ film, a SiO$_2$ film may be used. When the SiO$_2$ film is used as the block dielectric film 28, the memory cells having the MONOS structure using metal (M)-oxide film (O)-nitride film (N)-oxide film (O)-silicon (S) can be formed.

In the example described above, the case where the replacement step (S136) is executed through the memory hole 154 has been shown. However, the present disclosure is not limited thereto.

Figure 16:
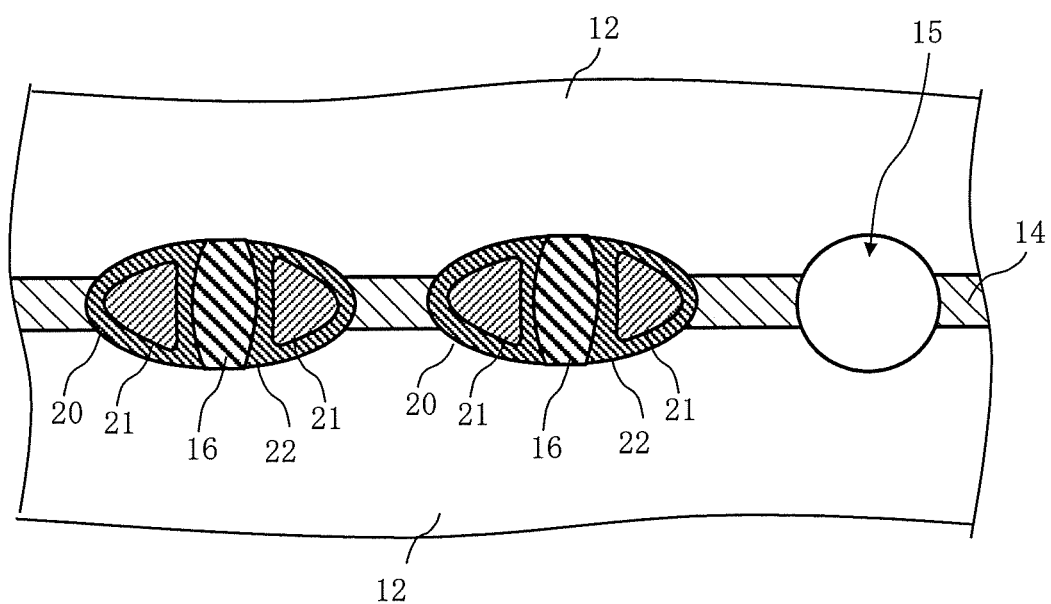
FIG. 16 is a diagram showing a modification of a replacement method to the conductive layer in the second embodiment.

FIG. 16 is a diagram showing a modification of a replacement method to the conductive layer in the second embodiment. In the modification of FIG. 16, a replacement hole 15 is formed after the channel film formation step (S148) is executed. Here, the replacement hole 15 having a diameter larger than a width dimension of the dielectric film wall 14 is formed at a position on the dielectric film wall 14 between the adjacent wires 10 to be the word lines shown in FIG. 9, which is a position not overlapping with the memory films 20 and 22. Then, as the replacement step (S136), the sacrificial film layer 30 of each layer is removed by etching through the replacement hole 15 and is replaced by a conductive material. Specifically, the sacrificial film layer 30 of each layer is removed by etching through the replacement hole 15 by a wet etching method (for example, hot phosphoric acid treatment). As a result, a space is formed between the dielectric layers 12 of the respective layers. Here, the memory films 20 and 22, the channel film 21, and the dielectric film walls 14 and 16 become pillars and can support the dielectric layer 12 of each layer so as not to collapse. However, in the modification of FIG. 16, after forming the memory films 20 and 22 and the channel film 21, the sacrificial film layer 30 is etched and replaced with the barrier metal film 11 and the word line by the wire 10. Therefore, in a case where the Al$_2$O$_3$ film with low etching resistance is used as the block dielectric film 28, the Al$_2$O$_3$ film at the location contacting the sacrificial film layer 30 when the sacrificial film layer 30 is etched and the charge accumulation film 26 having the same kind as the sacrificial film layer 30 may be removed at the same time. Therefore, when the memory films 20 and 22 are formed, the remaining charge accumulation film 26 and tunnel dielectric film 24 are formed without forming the block dielectric film 28. A cover SiO$_2$ film for protecting the charge accumulation film 26 is formed on the outer circumferential side (outermost circumference) of the charge accumulation film 26. In other words, before the barrier metal film and the conductive material are deposited after the sacrificial film layer 30 is etched, the block dielectric film 28 is formed through the replacement hole 15. Therefore, the Al$_2$O$_3$ film is formed on a surface of the dielectric layer 12 of each layer of the stacked film and the Al$_2$O$_3$ film is sandwiched between the layers of the word lines. It is to be noted that, since a problem of low etching resistance does not occur in a case of using the SiO$_2$ film as the block dielectric film 28, the modification of FIG. 16 is particularly effective when the SiO$_2$ film is used as the block dielectric film 28.

As described above, according to the second embodiment, it is possible to form memory cells four times as many as existing memory cells in the three-dimensional NAND type flash memory device. Therefore, higher integration of the three-dimensional NAND type flash memory device can be achieved. Further, according to the second embodiment, since the memory films and the channel film are not physically divided by vertical division using the lithography technology, damage to the memory film structure can be suppressed. Further, according to the second embodiment, it is possible to reliably surround the periphery of the channel film 21 used for each of the quadrupled memory cells with the tubular memory films 20 and 22, so that sufficient memory performance can be exerted.

Third Embodiment

Figure 17:
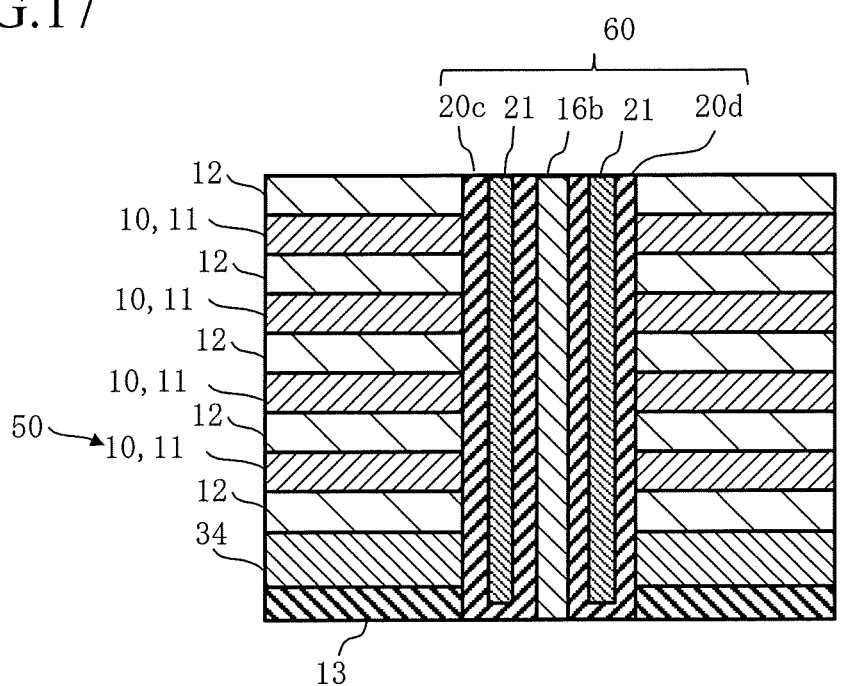
FIG. 17 is a cross-sectional view showing an example of a configuration of a semiconductor device according to a third embodiment.
Figure 18:
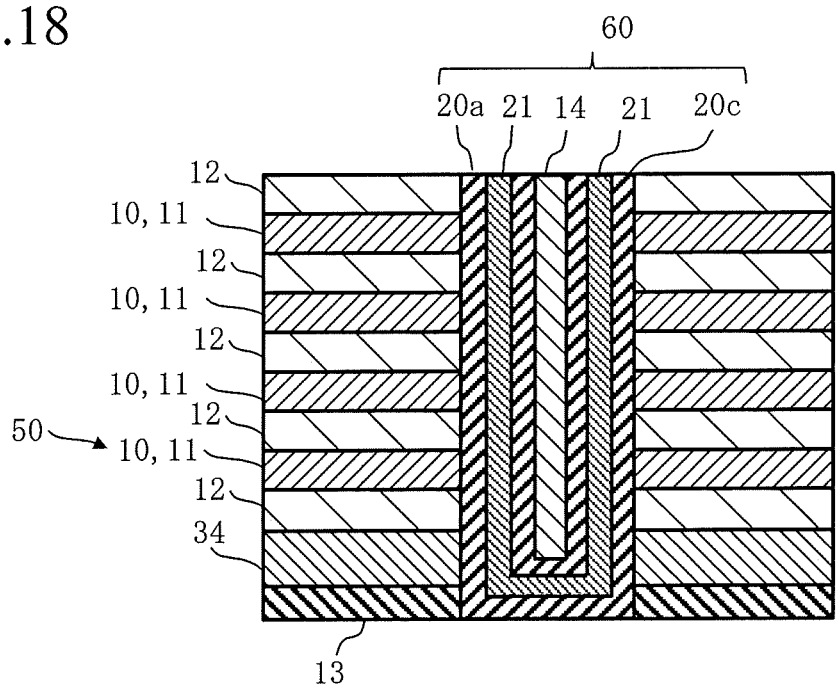
FIG. 18 is a cross-sectional view of another position showing an example of the configuration of the semiconductor device according to the third embodiment.
Figure 19:
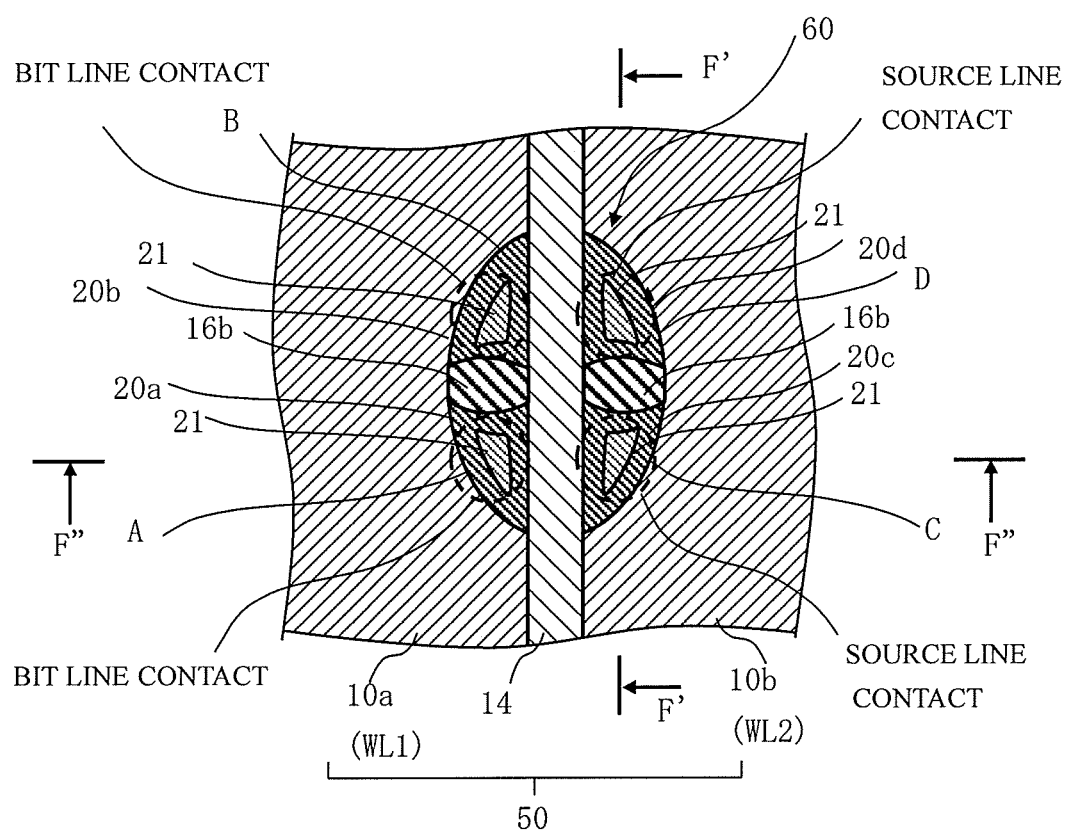
FIG. 19 is a top view showing an example of a configuration of a conductive layer and a memory cell of the semiconductor device according to the third embodiment.

FIG. 17 is a cross-sectional view showing an example of a configuration of a semiconductor device according to a third embodiment. FIG. 18 is a cross-sectional view of another position showing an example of the configuration of the semiconductor device according to the third embodiment. FIG. 19 is a top view showing an example of a configuration of a conductive layer and a memory cell of the semiconductor device according to the third embodiment. It is to be noted that the scales are not matched in FIGS. 17 to 19. In the examples of FIGS. 17 to 19, an example of a configuration of a memory element region in a semiconductor storage device to be an example of a semiconductor device is shown. FIG. 17 shows a cross-section (F'-F' cross-section) of a long diameter direction of an ellipse at a position excluding a dielectric film wall 14 of FIG. 19. FIG. 18 shows a cross-section (F"-F" cross-section) of a short diameter direction of an ellipse at a position excluding a dielectric film wall 16 of FIG. 19. In FIGS. 17 and 18, a barrier metal film 11 is denoted only by reference numeral and illustration thereof is omitted. In FIGS. 17 and 18, the semiconductor device according to the third embodiment has a plurality of layers of conductive layers 50 in which wires 10 to be word lines (WL) in the semiconductor storage device are formed. Further, the semiconductor device according to the third embodiment has a plurality of layers of dielectric layers 12 that insulate the conductive layers 50 adjacent to each other. The conductive layer 50 of each layer of the plurality of layers of conductive layers 50 and the dielectric layer 12 of each layer of the plurality of layers of dielectric layers 12 are alternately stacked. A stacked body of the plurality of layers of conductive layers 50 and the plurality of layers of dielectric layers 12 is separated by a dielectric film wall 14 (second dielectric film wall). As a result, as shown in FIG. 19, in the conductive layer 50 of each layer, a plurality of wires 10a and 10b to be the word line (WL) separated by the dielectric film wall 14 (second dielectric film wall) are formed in parallel. In other words, a group (first wire group) of the plurality of layers of wires 10a and a group (second wire group) of the plurality of layers of wires 10b are separated by the dielectric film wall 14 (second dielectric film wall). In the conductive layer 50 of each layer, the wire 10a (WL1: an example of a first wire) is formed at the same position. Similarly, in the conductive layer 50 of each layer, the wire 10b (WL2: an example of a second wire) is formed at the same position. The plurality of wires 10a and 10b are plate-like wires using the same conductive material. In the examples of FIGS. 17 and 18, the case where a base film 34 is disposed below the stacked body of the plurality of layers of conductive layers 50 and the plurality of layers of dielectric layers 12 and a base film 13 is disposed below the base film 34 is shown.

A plurality of elliptic cylinder regions 60 are disposed in a row in portions where the wires 10a and the wires 10b face each other with the dielectric film walls 14 therebetween. In the examples of FIGS. 17 to 19, one of the plurality of elliptic cylinder regions 60 is shown. Each elliptic cylinder region 60 penetrates a stacked body of the plurality of layers of conductive layers 50 and the plurality of layers of dielectric layers 12 in a direction orthogonal to a stacked surface. In each elliptic cylinder region 60, four memory films 20a, 20b, 20c, and 20d are disposed. Each elliptic cylinder region 60 is separated in a long diameter direction of the ellipse by the dielectric film wall 16 (first dielectric film wall), and is separated in a small diameter direction of the ellipse by the dielectric film wall 14 (second dielectric film wall). As the result, each elliptic cylinder region 60 is divided into four regions A to D. The memory film 20a (first memory film) is disposed in a region A (first region) to be one of the four regions A to D separated from the one elliptic cylinder region 60. The memory film 20b (second memory film) is disposed in a region B (second region) in the same elliptic cylinder region 60. The memory film 20c (third memory film) is disposed in a region C (third region) in the same elliptic cylinder region 60. The memory film 20d (fourth memory film) is disposed in a region D (fourth region) in the same elliptic cylinder region 60. As such, the dielectric film wall 14 and the dielectric film wall 16 separate each elliptic cylinder region 60 into the four regions in the long diameter direction and the short diameter direction of the ellipse. In addition, the channel film 21 is formed in a columnar shape along the inner wall surface of the memory film 20a. Similarly, the channel film 21 is formed in a columnar shape along the inner wall surface of the memory film 20b. Similarly, the channel film 21 is formed in a columnar shape along the inner wall surface of the memory film 20c. Similarly, the channel film 21 is formed in a columnar shape along the inner wall surface of the memory film 20d. In the examples of FIGS. 17 to 19, similar to the second embodiment, the long diameter direction of the ellipse of each elliptic cylinder region 60 is disposed substantially parallel to an extension direction of each wire 10. In the examples of FIGS. 17 to 19, unlike the first and second embodiments, the dielectric film wall 14 separating the wire 10a and the wire 10b of the conductive layer 50 of each layer contacts the dielectric film wall 16 of the elliptic cylinder region 60 located at the portion where the wire 10a and the wire 10b face each other with the dielectric film wall 14 while being substantially orthogonal to the dielectric film wall 16.

Although not shown in FIG. 19, in the semiconductor device of the third embodiment, similar to the first and second embodiments, a plurality of rows of dielectric film walls 14 separating a plurality of layers of wire groups to be a plurality of word lines (WL) in the semiconductor memory device are formed in parallel to each other. The plurality of elliptic cylinder regions 60 penetrating the stacked body of the plurality of layers of conductive layers 50 and the plurality of layers of dielectric layers 12 are disposed in a zigzag shape at positions overlapping with the plurality of rows of dielectric film walls 14 in plan view.

As shown in FIGS. 17 to 19, the groups of wires 10a of the plurality of layers of conductive layers 50 are formed in a plurality of layers in a longitudinal direction of the elliptic cylinder region 60 located at the portion where the wire 10a and the wire 10b face each other with the dielectric film wall 14 therebetween. Each group of wires 10a has a plate shape and extends in a direction orthogonal to the longitudinal direction of the column of the elliptic cylinder region 60. In addition, the group of wires 10a is connected to the memory film 20a (region A) and the memory film 20b (region B) of the elliptic cylinder region 60 located at the portion where the wires 10a and the wire 10b face each other with the dielectric film wall 14 therebetween. The groups of wires 10b of the plurality of layers of conductive layers 50 are provided in a plurality of layers in the same layer as the first wire group. Each group of wires 10b has a plate shape, is parallel to the group of wires 10a, and extends in a direction orthogonal to the longitudinal direction of the column of the elliptic cylinder region 60 located at the portion where the wires 10a and the wires 10b face each other with the dielectric film walls 14 therebetween. The group of wires 10b is connected to the memory film 20c (region C) and the memory film 20d (region D) of the elliptic cylinder region 60 located at the portion where the wire 10a and the wire 10b face each other with the dielectric film wall 14 therebetween.

In the conductive layer 50 of each layer, the combination of the wire 10a to be a word line, the memory film 20a of one elliptic cylinder region 60 located at the portion where the wire 10a and the wire 10b face each other with the dielectric film wall 14 therebetween, and the channel film 21 surrounded by the memory film 20a constitute one memory cell. In the conductive layer 50 of each layer, the combination of the wire 10a to be a word line, the memory film 20b of one elliptic cylinder region 60 located at the portion where the wire 10a and the wire 10b face each other with the dielectric film wall 14 therebetween, and the channel film 21 surrounded by the memory film 20b constitute one memory cell. In the conductive layer 50 of each layer, the combination of the wire 10b to be a word line, the memory film 20c of one elliptic cylinder region 60 located at the portion where the wire 10a and the wire 10b face each other with the dielectric film wall 14 therebetween, and the channel film 21 surrounded by the memory film 20c constitute one memory cell. In the conductive layer 50 of each layer, the combination of the wire 10b to be a word line, the memory film 20d of one elliptic cylinder region 60 located at the portion where the wire 10a and the wire 10b face each other with the dielectric film wall 14 therebetween, and the channel film 21 surrounded by the memory film 20d constitute one memory cell.

Among the four memory films 20a, 20b, 20c, and 20d of the same elliptic cylinder region 60, the memory films 20a and 20c are coupled across a portion below the dielectric film wall 14 in the same layer as the base films 34 and 13 under the stacked body of the plurality of layers of conductive layers 50 and the plurality of layers of dielectric layers 12, as shown in FIG. 18. Each channel film 21 surrounded by the memory films 20a and 20c are also coupled across the dielectric film wall 14 in the same layer as the base films 34 and 13 under the stacked body of the plurality of layers of conductive layers 50 and the plurality of layers of dielectric layers 12, as shown in FIG. 18. Therefore, one NAND string is constituted by a plurality of memory cells in which the memory cells formed in each conductive layer 50 of the group of wires 10a, which are connected to the memory film 20a of the same elliptic cylinder region 60 and the memory cells formed in each conductive layer 50 of the group of wires 10b, which are connected to the memory film 20c of the same elliptic cylinder region 60 are connected by the U-shaped channel film 21.

Among the four memory films 20*a*, 20*b*, 20*c*, and 20*d* of the same elliptic cylinder region 60, the memory films 20*b* and 20*d* are coupled across the dielectric film wall 14 in the same layer as the base films 34 and 13 under the stacked body of the plurality of layers of conductive layers 50 and the plurality of layers of dielectric layers 12, similar to the case of the memory films 20*a* and 20*c*. Each channel film 21 surrounded by the memory films 20*b* and 20*d* are coupled across the dielectric film wall 14 in the same layer as the base films 34 and 13 under the stacked body of the plurality of layers of conductive layers 50 and the plurality of layers of dielectric layers 12. Therefore, one NAND string is constituted by a plurality of memory cells in which the memory cells formed in each conductive layer 50 of the group of wires 10*a*, which are connected to the memory film 20*b* of the same elliptic cylinder region 60 and the memory cells formed in each conductive layer 50 of the group of wires 10*b*, which are connected to the memory film 20*d* of the same elliptic cylinder region 60 are connected by the U-shaped channel film 21.

A bit line contact is connected to the channel film 21 surrounded by the memory film 20*a* of the same elliptic cylinder region 60 constituting one NAND string and a source line contact is connected to the channel film 21 surrounded by the memory film 20*c* of the same elliptic cylinder region 60. Similarly, a bit line contact is connected to the channel film 21 surrounded by the memory film 20*b* of the same elliptic cylinder region 60 constituting one NAND string and a source line contact is connected to the channel film 21 surrounded by the memory film 20*d* of the same elliptic cylinder region 60. Alternatively, a source line contact is connected to the channel film 21 surrounded by the memory film 20*a* of the same elliptic cylinder region 60 constituting one NAND string and a bit line contact is connected to the channel film 21 surrounded by the memory film 20*c* of the same elliptic cylinder region 60. Similarly, a source line contact is connected to the channel film 21 surrounded by the memory film 20*b* of the same elliptic cylinder region 60 constituting one NAND string and a bit line contact is connected to the channel film 21 surrounded by the memory film 20*d* of the same elliptic cylinder region 60.

As described above, in the third embodiment, instead of forming one memory cell by one memory film and one channel film, memory cells by the four memory films 20*a*, 20*b*, 20*c*, and 20*d* and the respective channel films are formed in the same elliptic cylinder region 60. Thereby, in each conductive layer 50, four memory cells are formed for each of the same elliptic cylinder regions 60. For this reason, the density of the memory cells can be further increased as compared with the first embodiment. Therefore, higher integration can be achieved in the three-dimensional NAND type flash memory device.

Figure 20:
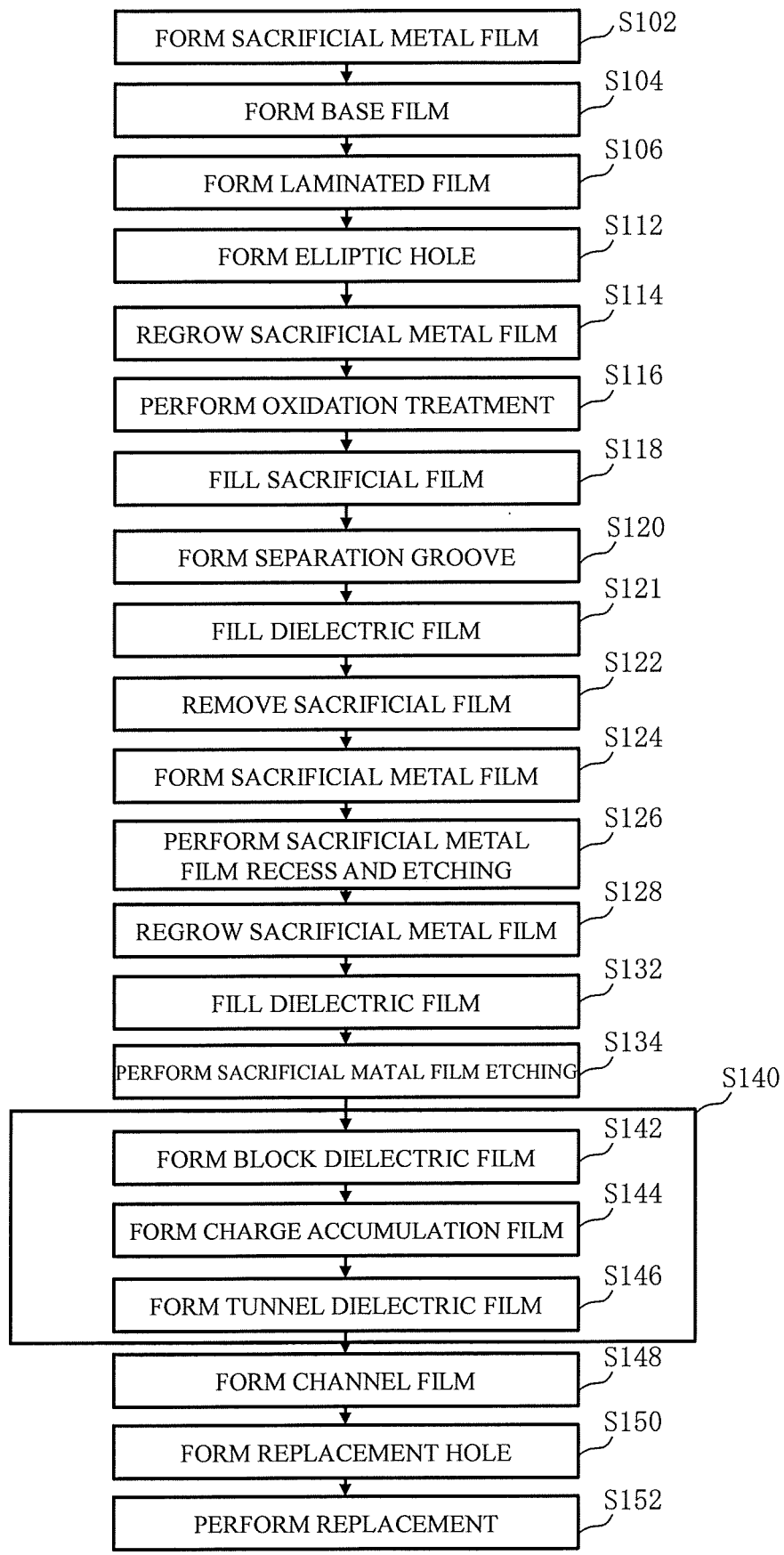
FIG. 20 is a flowchart showing main steps of a method for fabricating the semiconductor device according to the third embodiment.

FIG. 20 is a flowchart showing main steps of a method for fabricating the semiconductor device according to the third embodiment. FIG. 20 is the same as FIG. 3 in that, in a method for fabricating the semiconductor device according to the third embodiment, a sacrificial metal film formation step (S102) and a base film formation step (S104) are executed before a stacked film formation step (S106), a sacrificial metal film regrowth step (S114), an oxidation treatment step (S116), a sacrificial film filling step (S118), a separation groove formation step (S120), a dielectric film filling step (S121), and a sacrificial film removing step (S122) are executed between an elliptic hole formation step (S112) and a sacrificial metal film formation step (S124), a separation groove formation step (S130), a replacement step (S136), and a memory hole etching step (S138) are removed, and a replacement hole formation step (S150) and a replacement step (S152) are executed after a channel film formation step (S148).

Therefore, in FIG. 20, in the method for fabricating the semiconductor device according to the third embodiment, a series of steps including the sacrificial metal film formation step (S102), the base film formation step (S104), the stacked film formation step (S106), the elliptic hole formation step (S112), the sacrificial metal film regrowth step (S114), the oxidation treatment step (S116), the sacrificial film filling step (S118), the separation groove formation step (S120), the dielectric film filling step (S121), the sacrificial film removing step (S122), a sacrificial metal film formation step (S124), a sacrificial metal film recess and etching step (S126), a sacrificial metal film regrowth step (S128), a dielectric film formation step (S132), a sacrificial metal film etching step (S134), a memory film formation step (S140), a channel film formation step (S148), a replacement hole formation step (S150), and a replacement step (S152) is executed. In the memory film formation step (S140), a series of steps including a block dielectric film formation step (S142), a charge accumulation film formation step (S144), and a tunnel dielectric film formation step (S146) is executed as internal steps.

First, as the sacrificial metal film formation step (S102), a sacrificial metal film 33 is formed on a semiconductor substrate by using an ALD method, an ALCVD method, or a CVD method, for example. As a material of the sacrificial metal film 33, for example, W is preferably used. As the semiconductor substrate, for example, a silicon wafer having a diameter of 300 mm is used. On or in the semiconductor substrate, dielectric films, back gate electrodes, wires, contacts, and/or semiconductor elements such as transistors, which are not shown in the drawings, may be formed.

Next, as the base film formation step (S104), a base film 34 is formed on the sacrificial metal film 33 by using the ALD method, the ALCVD method, or the CVD method, for example. As the material of the base film 34, for example, polysilicon is preferably used.

Next, as the stacked film formation step (S106), a sacrificial film layer 30 and a dielectric layer 12 are alternately stacked on the base film 34 by using the ALD method, the ALCVD method, or the CVD method, for example. The contents of the stacked film formation step (S106) are the same as those of the first embodiment, except that the sacrificial film layer 30 and a dielectric layer 12 are formed on the base film 34.

FIGS. 21A to 21F are cross-sectional and cross-sectional position diagrams showing a part of the steps of the method for fabricating the semiconductor device according to the third embodiment; FIGS. 21A to 21F show the elliptic hole formation step (S112) to the sacrificial film filling step (S118) in FIG. 20. The subsequent steps will be described later. FIG. 21A shows an F-F cross-section of FIG. 21B. FIG. 21C shows an F-F cross-section of FIG. 21D. FIG. 21E shows an F-F cross-section of FIG. 21F.

In FIGS. 21A and 21B, as the elliptic hole formation step (S112), an elliptic opening (elliptic hole 152) penetrating the stacked film from above the dielectric layer 12 is formed. Here, a plurality of elliptic holes 152 are formed along a longitudinal direction of the wires 10 at positions on the dielectric film walls 14 between the adjacent wires 10 to be the word lines shown in FIG. 19. In a state in which a resist film is formed on the dielectric layer 12 through a lithography step such as a resist coating step and an exposing step not shown in the drawings, the sacrificial metal film 33 is used as an etching stopper and the exposed dielectric layer 12, a stacked film of the sacrificial film layer 30 and the dielectric layer 12 located below the exposed dielectric layer 12, and the base film 34 are removed by an anisotropic etching method. As a result, the elliptic hole 152 can be formed substantially perpendicularly to a surface of the dielectric layer 12. For example, the elliptic hole 152 may be formed by the RIE method. Here, each elliptic hole 152 is preferably formed so that a long diameter direction is oriented in the longitudinal direction of the wire 10 to be the word line shown in FIG. 19, unlike the first embodiment. In addition, each elliptic hole 152 is not limited to a complete elliptic shape. Each elliptic hole 152 may have a shape which has a long diameter and a short diameter and in which a curvature of a side portion in a long diameter direction is larger than a curvature of a side portion in a short diameter direction. For example, each elliptic hole 152 may have the oval shape or the like.

In FIGS. 21C and 21D, as the sacrificial metal film regrowth step (S114), a portion exposed to a bottom of the elliptic hole 152 in the sacrificial metal film 33 is regrown by using the ALD method, the ALCVD method, or the CVD method, for example. For example, the film is formed up to the intermediate height position of the base film 34. Here, the surface of the sacrificial metal film 33 is grown so as to be lower than the sacrificial film layer 30 of the lowermost layer in the stacked film of the sacrificial film layer 30 and the dielectric layer 12.

As the oxidation treatment step (S116), the oxidation treatment is performed by heating the sacrificial film exposed surface of the sacrificial film layer 30 exposed on the sidewall of the elliptic hole 152 and the exposed surface portion is changed to an oxide film 17. For example, the exposed surface portion is changed to an SiO2 film as the oxide film 17. Either the sacrificial metal film regrowth step (S114) or the oxidation treatment step (S116) may be first performed. Alternatively, these steps may be performed at the same time.

In FIGS. 21E and 21F, as the sacrificial film filling step (S118), the sacrificial film 35 is filled into the elliptic hole 152 by using the ALD method, the ALCVD method, or the CVD method, for example. As the material of the sacrificial film 35, for example, SiN is preferably used.

FIGS. 22A to 22F are cross-sectional and cross-sectional position diagrams showing another part of the steps of the method for fabricating the semiconductor device according to the third embodiment. FIGS. 22A to 22F show the separation groove formation step (S120) to the sacrificial metal film formation step (S124) in FIG. 20. The subsequent steps will be described later. FIG. 22A shows an F-F cross-section of FIG. 22B. FIG. 22C shows an F-F cross-section of FIG. 22D. FIG. 22E shows an F'-F' cross-section of FIG. 22F.

In FIGS. 22A and 22B, first, as the separation groove formation step (S120), separation grooves for separating a region are formed in the stacked film of the sacrificial film layer 30 and the dielectric layer 12 and the sacrificial film 35 filled into the elliptic hole 152 formed in the stacked film. The separation grooves are formed so as to penetrate the stacked film and the sacrificial film 35 at positions separating a plurality of word lines 10 of each layer shown in FIG. 19. In other words, the separation groove is formed at a position dividing the elliptic hole 152 into two parts in the short diameter direction along the long diameter direction of the elliptic hole 152 filled with the sacrificial film 35. In a state in which a resist film is formed on the dielectric layer 12 through a lithography step such as a resist coating step and an exposing step not shown in the drawings, the sacrificial metal film 33 is used as an etching stopper and the exposed dielectric layer 12, a stacked film of the sacrificial film layer 30 and the dielectric layer 12 located below the exposed dielectric layer 12, and the sacrificial film 35 are removed by an anisotropic etching method. As a result, the separation grooves can be formed substantially perpendicularly to a surface of the dielectric layer 12. For example, the separation grooves may be formed by an RIE method.

Next, as the dielectric film filling step (S121), the dielectric film walls 14 are formed by filling the formed separation grooves with a dielectric material by using the ALD method, the ALCVD method, or the CVD method, for example. A material different from the material of the sacrificial film layer 30 and the sacrificial film 35 is used as the dielectric material used for the dielectric film wall 14. For example, it is preferable to use $SiO_2$. Since the dielectric film wall 14 is formed on the sacrificial metal film 33, the height of the bottom surface of the dielectric film wall 14 in the elliptic hole 152 can be set to the position lower than the sacrificial film layer 30 of the lowermost layer in the stacked film of the sacrificial film layer 30 and the dielectric layer 12, which is about the intermediate height position of the base film 34.

In FIGS. 22C and 22D, as the sacrificial film removing step (S122), the sacrificial film 35 filled into the elliptic hole 152 is removed by a wet etching method (for example, hot phosphoric acid treatment). Since the sidewall portion of the elliptic hole 152 of the sacrificial film layer 30 is changed to the oxide film 17, removal of the sacrificial film layer 30 by the above treatment can be avoided. As a result, two openings 151 are formed in which the elliptic hole 152 is divided into two parts in the short diameter direction by the dielectric film wall 14.

In FIGS. 22E and 22F, as the sacrificial metal film formation step (S124), the sacrificial metal film 37 is formed in the two openings 151 (151a and 151b) in which the elliptic hole 152 is divided into the two parts in the short diameter direction by the dielectric film wall 14, by using the ALD method, the ALCVD method, or the CVD method, for example. As a material of the sacrificial metal film 37, the same kind of material as the sacrificial metal film 33 is used. For example, it is preferable to use W. Here, the sacrificial metal film 37 is not deposited until each opening 151 is completely filled with the sacrificial metal film 37. For example, it is desirable to form each opening so that a cavity not yet filled remains in a columnar shape in the center portion of each opening 151. In the third embodiment, film formation of the sacrificial metal film 37 proceeds faster in the sidewall portion of the long diameter direction having a small curvature radius (large curvature) than in the sidewall portion of the short diameter direction having a large curvature radius (small curvature) to fill the sacrificial metal film 37 into the two openings 151 in which the elliptic hole 152 is divided into the two parts in the short diameter direction by the dielectric film wall 14. Therefore, the film thickness of the sacrificial metal film 37 formed on the sidewall portion of the long diameter direction having the large curvature rather than the sidewall portion of the short diameter direction having the small curvature can be increased.

FIGS. 23A to 23F are cross-sectional and cross-sectional position diagrams showing another part of the steps of the method for fabricating the semiconductor device according to the third embodiment. FIGS. 23A to 23F show the sacrificial metal film recess and etching step (S126) to the sacrificial metal film etching step (S134) in FIG. 20. The subsequent steps will be described later. FIG. 23A shows an F'-F' cross-section of FIG. 23B. FIG. 23C shows an F'-F' cross-section of FIG. 23D. FIG. 23E shows an F'-F' cross-section of FIG. 23F.

In FIGS. 23A and 23B, as the sacrificial metal film recess and etching step (S126), a recess shape is formed in the sacrificial metal film 37 by etching the sacrificial metal film 37 in each opening 151 by the wet etching method (for example, mixed acid treatment), for example. Specifically, the recess shape of the sacrificial metal film 37 is formed so that the sacrificial metal film 37 of the sidewall portion of the short diameter direction having a small curvature is removed and the sacrificial metal film 37 remains in the sidewall portion of the long diameter direction having a large curvature. Next, the sacrificial metal film 33 of the bottom portion of the opening 151 is removed by etching using the RIE method while maintaining the recess shape of the sacrificial metal film 37.

In FIGS. 23C and 23D, as the sacrificial metal film regrowth step (S128), the sacrificial metal film 37 having the recess shape in each opening 151 is regrown by using the ALD method, the ALCVD method, or the CVD method, for example. The contents of the sacrificial metal film regrowth step (S128) may be the same as those of the first embodiment. As a result, in a state in which the sacrificial metal film 37 does not exist in the space between both the sidewall portions in the short diameter direction of the elliptic hole 152 and the dielectric film wall 14, the sidewall portion of the dielectric film wall 14 near the short diameter position of the elliptic hole 152, and the sidewall portion of the elliptic hole 152 near the short diameter position of the elliptic hole 152, the two regions in each opening 151 separated by the space between both the sidewall portions in the short diameter direction are filled with the sacrificial metal film 37.

Next, as the dielectric film formation step (S132), the dielectric film walls 16 are formed by filling the space remaining in each opening 151 with the dielectric material by using the ALD method, the ALCVD method, or the CVD method, for example. A material different from a material of a sacrificial film of the sacrificial film layer 30 is used as the dielectric material used for the dielectric film wall 16. For example, it is preferable to use SiO$_2$. In the third embodiment, the dielectric film wall 14 and the dielectric film wall 16 are disposed to contact each other while being substantially orthogonal to each other in the elliptic hole 152. Here, the bottom surface height of the dielectric film wall 14 is approximately the intermediate height position of the base film 34, whereas the bottom surface height of the dielectric film wall 16 reaches the bottom surface height position of the sacrificial metal film 33.

In FIGS. 23E and 23F, as the sacrificial metal film etching step (S134), the sacrificial metal film 37 separated into the two regions by the dielectric film wall 16 in each opening 151 and deposited in each region is etched and removed by the wet etching method (for example, mixed acid treatment), for example. At the same time, the sacrificial metal film 33 is also removed. By this step, four memory holes 154 separated by the dielectric film wall 14 and the dielectric film wall 16 (16a and 16b) substantially orthogonal to each other are formed in the elliptic hole 152. Among the four memory holes 154, two memory holes 154 facing each other with the dielectric film wall 14 therebetween are formed so as to be connected on the layer side lower than the bottom surface of the dielectric film wall 14 on one of two regions separated from each other in the long diameter direction of the elliptic hole 152 by the dielectric film wall 16 in the elliptic hole 152. Similarly, the other two memory holes 154 facing each other with the dielectric film wall 14 therebetween are formed so as to be connected on the layer side lower than the bottom surface of the dielectric film wall 14 on the other of the two regions separated from each other in the long diameter direction of the elliptic hole 152 by the dielectric film wall 16 in the elliptic hole 152.

Figure 24A:
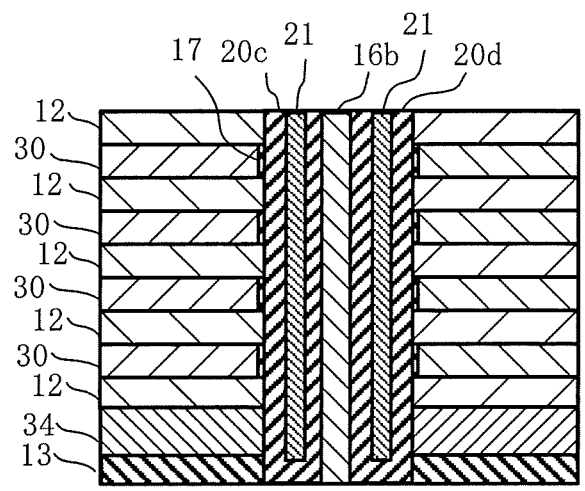
FIGS. 24A to 24C are cross-sectional and cross-sectional position diagrams showing another part of the steps of the method for fabricating the semiconductor device according to the third embodiment.
Figure 24B:
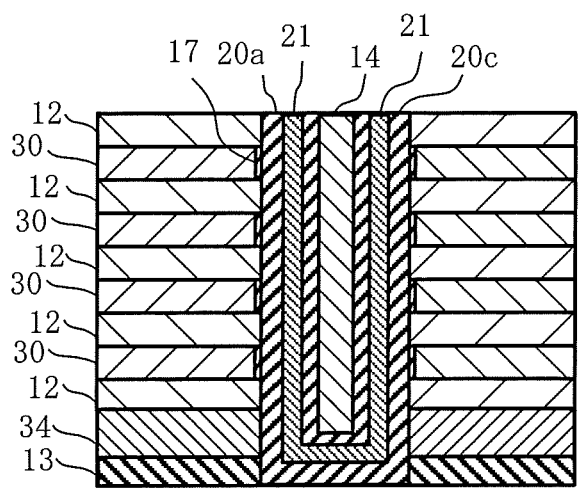
Figure 24C:
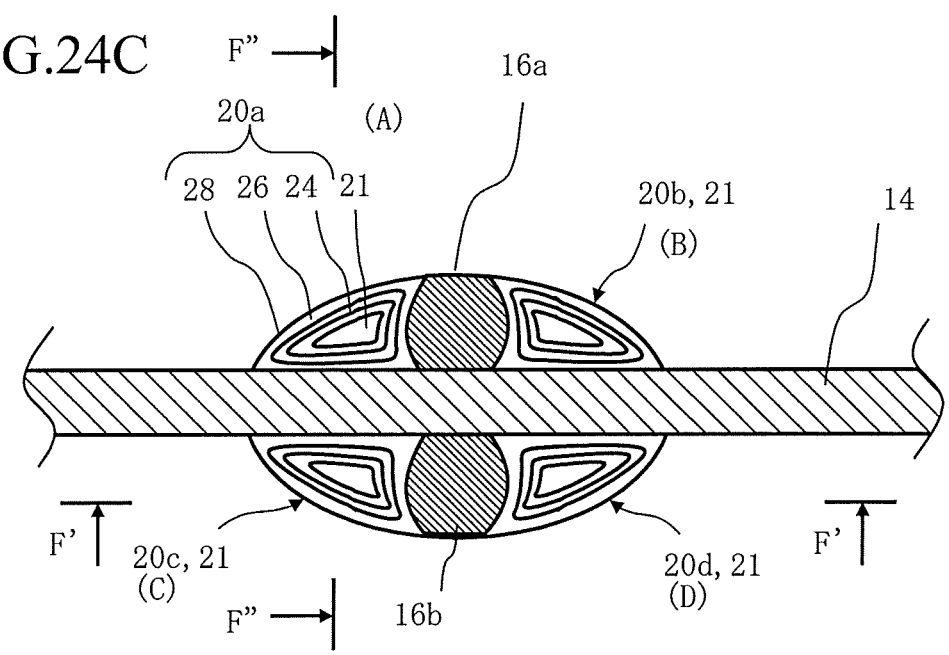

FIGS. 24A to 24C are cross-sectional and cross-sectional position diagrams showing another part of the steps of the method for fabricating the semiconductor device according to the third embodiment. FIGS. 24A to 24C show the memory film formation step (S140) and the channel film formation step (S148) in FIG. 20. The subsequent steps will be described later. FIG. 24A shows an F'-F' cross-section of FIG. 24C. FIG. 24B shows an F"'-F"' cross-section of FIG. 24C. It is to be noted that the scales are not matched in FIGS. 24A to 24C.

In FIGS. 24A to 24C, as the memory film formation step (S140), the memory films 20 (20a, 20b, 20c, and 20d) are formed in the four memory holes 154 connected two by two on the lower layer side. The contents of the memory film formation step (S140) (block dielectric film formation step (S142), the charge accumulation film formation step (S144), and the tunnel dielectric film formation step (S146)) are the same as those of the first embodiment. However, in the third embodiment, SiO$_2$ is used as the material of the block dielectric film 28 formed in the block dielectric film formation step (S142).

In the third embodiment, as shown in FIG. 24C, the block dielectric film 28 (first block dielectric film) disposed in a tubular shape along the sidewall surface of one region A among the four regions of the elliptic cylinder region separated by the dielectric film wall 14 and the dielectric film wall 16 can be formed as a part of the memory film 20a (first memory film). Similarly, the block dielectric film 28 (second block dielectric film) disposed in a tubular shape along the sidewall surface of another region B among the four regions of the elliptic cylinder region separated by the dielectric film wall 14 and the dielectric film wall 16 can be formed as a part of the memory film 20b (second memory film). Similarly, the block dielectric film 28 (third block dielectric film) disposed in a tubular shape along the sidewall surface of another region C among the four regions of the elliptic cylinder region separated by the dielectric film wall 14 and the dielectric film wall 16 can be formed as a part of the memory film 20c (third memory film). Similarly, the block dielectric film 28 (fourth block dielectric film) disposed in a tubular shape along the sidewall surface of another region D among the four regions of the elliptic cylinder region separated by the dielectric film wall 14 and the dielectric film wall 16 can be formed as a part of the memory film 20d (fourth memory film). In addition, among the memory films 20a, 20b, 20c, and 20d, the memory films 20a and 20c are formed so as to be connected on the layer side lower than the bottom surface of the dielectric film wall 14, as shown in FIG. 24B. Similarly, the memory films 20b and 20d are formed so as to be connected on the layer side lower than the bottom surface of the dielectric film wall 14. Therefore, the block dielectric films 28 of the memory films 20a and 20c are formed so as to be connected on the layer side lower than the bottom surface of the dielectric film wall 14. Similarly, the block dielectric films 28 of the memory films 20b and 20d are formed so as to be connected on the layer side lower than the bottom surface of the dielectric film wall 14. Further, with respect to the space formed by removing the sacrificial metal film 33 by the sacrificial metal film etching step (S134), the region under the stacked film around the elliptic cylinder region 60 is simultaneously filled with the material of the block dielectric film 28 and closed in the block dielectric film formation step (S142), so that the base film 13 is formed. On the other hand, the space formed by removing the sacrificial metal film 33 under the dielectric film wall 14 in the elliptic cylinder region 60 can be left without being filled with the material of the block dielectric film 28 by the amount of sacrificial metal film 33 accumulated in the sacrificial metal film regrowth step (S114). However, the space (space between the dielectric film wall 16a and the dielectric film wall 16b) below the dielectric film wall 14 where the dielectric film wall 14 and the dielectric film wall 16 intersect is filled with the material of the block dielectric film 28 and closed.

In the third embodiment, a charge accumulation film 26 (first charge accumulation film) disposed in a tubular shape along the inner wall surface of the block dielectric film 28 can be formed as a part of the memory film 20a (first memory film). Similarly, the charge accumulation film 26 (second charge accumulation film) disposed in a tubular shape along the inner wall surface of the block dielectric film 28 can be formed as a part of the memory film 20b (second memory film). Similarly, the charge accumulation film 26 (third charge accumulation film) disposed in a tubular shape along the inner wall surface of the block dielectric film 28 can be formed as a part of the memory film 20c (third memory film). Similarly, the charge accumulation film 26 (fourth charge accumulation film) disposed in a tubular shape along the inner wall surface of the block dielectric film 28 can be formed as a part of the memory film 20d (fourth memory film). In addition, among the memory films 20a, 20b, 20c, and 20d, the charge accumulation films 26 of the memory films 20a and 20c are formed so as to be connected on the layer side lower than the bottom surface of the dielectric film wall 14. Similarly, the charge accumulation films 26 of the memory films 20b and 20d are formed so as to be connected on the layer side lower than the bottom surface of the dielectric film wall 14.

In the third embodiment, the tunnel dielectric film 24 (first tunnel dielectric film) disposed in a tubular shape along the inner wall surface of the charge accumulation film 26 can be formed as a part of the memory film 20a (first memory film). Similarly, the tunnel dielectric film 24 (second tunnel dielectric film) disposed in a tubular shape along the inner wall surface of the charge accumulation film 26 can be formed as a part of the memory film 20b (second memory film). Similarly, the tunnel dielectric film 24 (third tunnel dielectric film) disposed in a tubular shape along the inner wall surface of the charge accumulation film 26 can be formed as a part of the memory film 20c (third memory film). Similarly, the tunnel dielectric film 24 (fourth tunnel dielectric film) disposed in a tubular shape along the inner wall surface of the charge accumulation film 26 can be formed as a part of the memory film 20d (fourth memory film). In addition, among the memory films 20a, 20b, 20c, and 20d, the tunnel dielectric films 24 of the memory films 20a and 20c are formed so as to be connected on the layer side lower than the bottom surface of the dielectric film wall 14. Similarly, the tunnel dielectric films 24 of the memory films 20b and 20d are formed so as to be connected on the layer side lower than the bottom surface of the dielectric film wall 14. In addition, the portion formed by connecting the memory films 20a, 20b, 20c, and 20d on the layer side lower than the bottom surface of the dielectric film wall 14 (the space below the dielectric film wall 14 between the region A and the region C and the space below the dielectric film wall 14 between the region B and the region D) has not been buried and closed by the memory films 20a, 20b, 20c, and 20d and a space is allocated to the inner side of the tunnel dielectric film 24.

In FIGS. 24A to 24C, in the channel film formation step (S148), the channel films 21 (first to fourth channel films) are formed in a columnar shape along the inner wall surfaces of the tubular tunnel dielectric films 24 (first to fourth tunnel dielectric films), respectively. In FIGS. 24A to 24C, each of the channel films 21 (first to fourth channel films) is formed in a columnar shape along the entire circumference of the inner wall surface of the corresponding tunnel dielectric film 24. In addition, among the channel films 21 of the same elliptic cylinder region 60, the two channel films 21 surrounded by the memory films 20a and 20c are formed so that a pair of columnar portions formed using a semiconductor material is connected in a U shape via a connection portion on the layer side lower than the bottom surface of the dielectric film wall 14, as shown in FIG. 24B. Similarly, the two channel films 21 surrounded by the memory films 20b and 20d are formed so that a pair of columnar portions formed using a semiconductor material is connected in a U shape via a connection portion on the layer side lower than the bottom surface of the dielectric film wall 14. In the example of FIGS. 24A to 24C, a set of two channel films 21 surrounded by the memory films 20a and 20c is disposed in a non-contact manner with a set of two channel films 21 surrounded by the memory films 20b and 20d. On the other hand, since the base film 13 has already been formed, it is possible to avoid connection of the channel films 21 between the different elliptic cylinder regions 60. Since the channel films 21 are separated by the dielectric film wall 16, it is possible to avoid connection of the channel films 21 facing each other with the dielectric film wall 16 therebetween within the same elliptic cylinder region 60. In each columnar channel film 21, a tubular structure may be formed using a semiconductor material and a core portion using a dielectric material may be disposed in an inner portion thereof.

Figure 25:
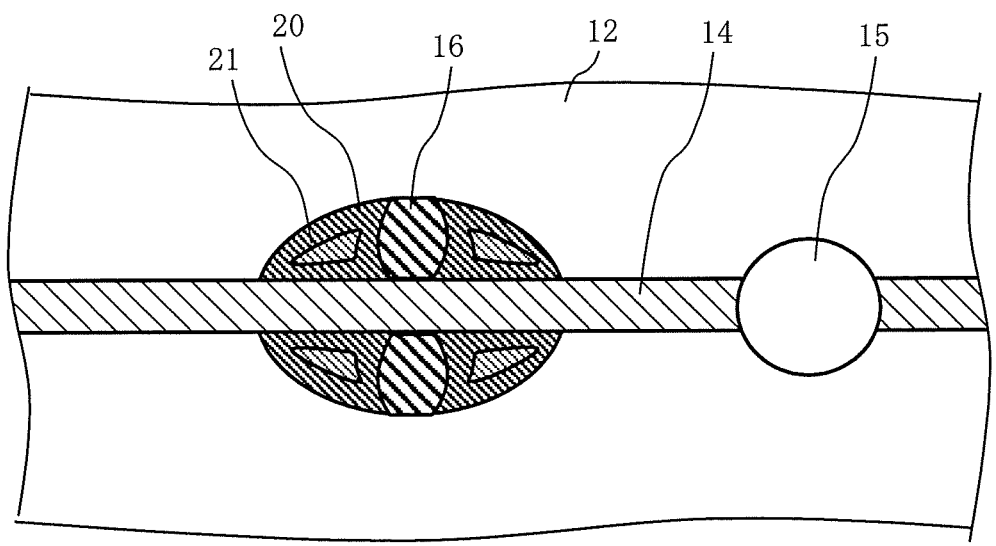
FIG. 25 is a diagram illustrating a replacement method to the conductive layer in the third embodiment.

FIG. 25 is a diagram illustrating a replacement method to the conductive layer in the third embodiment. In the third embodiment, a replacement hole 15 is formed after the memory film formation step (S140) is executed.

In FIG. 25, in the replacement hole formation step (S150), the replacement hole 15 having a diameter larger than a width dimension of the dielectric film wall 14 is formed at a position on the dielectric film wall 14 between the adjacent wires 10 to be the word lines shown in FIG. 19, which is a position not overlapping with the memory films 20a, 20b, 20c, and 20d.

Next, in the replacement step (S152), the sacrificial film layer 30 of each layer is removed by etching through the replacement hole 15 and is replaced by a conductive material. Specifically, the sacrificial film layer 30 of each layer is removed by etching through the replacement hole 15 by a wet etching method (for example, hot phosphoric acid treatment). As a result, a space is formed between the dielectric layers 12 of the respective layers. Here, the memory films 20a and 20c and the channel film 21 connected on the layer side lower than the bottom surface of the dielectric film wall 14 and the memory films 20b and 20d and the channel film 21 connected on the layer side lower than the bottom surface of the dielectric film wall 14 as well become pillars and can support the dielectric layer 12 of each layer so as not to collapse.

Next, the barrier metal film 11 denoted only by reference numerals in FIGS. 17 and 18 is formed on the upper and lower wall surfaces and the sidewalls of the space between the dielectric layers 12 of the respective layers via the replacement hole 15 by using the ALD method, the ALCVD method, or the CVD method, for example. Then, a conductive material to be the wires 10 is filled into the space between the dielectric layers 12 of the respective layers via the replacement hole 15 by using the ALD method, the ALCVD method, or the CVD method. As the barrier metal film 11, for example, TiN is preferably used. Further, W is preferably used as the conductive material to be the wire 10. By this step, the plurality of wires 10 (10*a*, and 10*b*) separated by the dielectric film wall 14 can be formed in the conductive layer 50 shown in FIG. 19.

As described above, according to the third embodiment, it is possible to form memory cells four times as many as existing memory cells in the three-dimensional NAND type flash memory device. Therefore, higher integration of the three-dimensional NAND type flash memory device can be achieved. Further, according to the third embodiment, since the formed memory films 20 and channel films 21 are not physically divided by vertical division using the lithography technology, damage to the memory film structure can be suppressed. Further, according to the third embodiment, it is possible to reliably surround the periphery of the channel film 21 used for each of the quadrupled memory cells with the tubular memory film 20, so that sufficient memory performance can be exerted.

The embodiments have been described with reference to the specific examples. However, the present disclosure is not limited to these specific examples.

Further, the thickness of each film and the size, the shape, and the number of openings can be appropriately selected and used as desired for semiconductor integrated circuits and various semiconductor elements.

Further, all semiconductor devices including the elements of the present disclosure and capable of being appropriately designed and changed by those skilled in the art and methods for fabricating the semiconductor devices are included in the scope of the present disclosure.

For simplicity of explanation, methods commonly used in the semiconductor industry, for example, photolithography processes, cleaning before and after processes, and the like are omitted. However, it is needless to say that these methods can be included.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first dielectric film wall configured to separate one elliptic cylinder region into two regions in a long diameter direction of an ellipse;
   a first memory film disposed in a tubular shape along a sidewall surface of one region of the two regions into which the elliptic cylinder region is separated by the first dielectric film wall and having a first charge accumulation film;
   a second memory film disposed in a tubular shape along a sidewall surface of another region of the two regions into which the elliptic cylinder region is separated by the first dielectric film wall and having a second charge accumulation film;
   first wire groups provided in a plurality of layers in a longitudinal direction of the elliptic cylinder region, each of the first wire groups having a plate shape, extending in a direction orthogonal to the longitudinal direction of the elliptic cylinder region, and being connected to the first memory film;
   second wire groups provided in a plurality of layers being the same layers as the first wire groups, each of the second wire groups having a plate shape, being parallel to the first wire groups, extending in the direction orthogonal to the longitudinal direction of the elliptic cylinder region, and being connected to the second memory film;
   a first channel film disposed in a columnar shape along an inner wall surface of the first memory film;
   a second channel film disposed in a columnar shape along an inner wall surface of the second memory film; and
   a second dielectric film wall formed integrally with the first dielectric film wall and separating the plurality of layers of the first wire groups and the plurality of layers of the second wire groups.

2. The device according to claim 1, wherein each of the first and second memory films includes an aluminum oxide ($Al_2O_3$) film functioning as a block dielectric film disposed in a tubular shape to be continuous in the longitudinal direction of the elliptic cylinder region.

3. The device according to claim 1, wherein the plurality of layers of the first wire groups and the plurality of layers of the second wire groups extend in a short diameter direction of the ellipse of the elliptic cylinder region.

4. The device according to claim 1, wherein the first channel film is disposed in the columnar shape along an entire circumference of the inner wall surface of the first memory film and the second channel film is disposed in the columnar shape along an entire circumference of the inner wall surface of the second memory film.

5. The device according to claim 1, wherein the first memory film and the second memory film are disposed to contact wall surfaces opposite to each other respectively in both wall surfaces of the first dielectric film wall.

6. The device according to claim 3, wherein a plurality of elliptic cylinder regions each of which is provided with the first dielectric film wall, the first and second memory films, and the first and second channel films, and a plurality of portions where the plurality of layers of the first wire groups and the plurality of layers of the second wire groups face each other with the second dielectric film wall therebetween, are alternately arranged in the short diameter direction of the ellipse of the elliptic cylinder region.

7. The device according to claim 6, wherein the plurality of layers of the first wire groups are connected to the first memory film of each of the plurality of elliptic cylinder regions and the plurality of layers of the second wire groups are connected to the second memory film of each of the plurality of elliptic cylinder regions.

8. A semiconductor device comprising:
   a first dielectric film wall configured to separate one elliptic cylinder region into two regions in a long diameter direction of an ellipse;
   a first memory film disposed in a tubular shape along a sidewall surface of one region of the two regions into which the elliptic cylinder region is separated by the first dielectric film wall and having a first charge accumulation film;

a second memory film disposed in a tubular shape along a sidewall surface of another region of the two regions into which the elliptic cylinder region is separated by the first dielectric film wall and having a second charge accumulation film;

first wire groups provided in a plurality of layers in a longitudinal direction of the elliptic cylinder region, each of the first wire groups having a plate shape, extending in a direction orthogonal to the longitudinal direction of the elliptic cylinder region, and being connected to a part of the first memory film and a part of the second memory film on one side of a short diameter direction of the ellipse of the elliptic cylinder region;

second wire groups provided in a plurality of layers being the same layers as the first wire groups, each of the second wire groups having a plate shape, being parallel to the first wire groups, extending in the direction orthogonal to the longitudinal direction of the elliptic cylinder region, and being connected to another part of the first memory film and another part of the second memory film on another side of the short diameter direction of the ellipse of the elliptic cylinder region;

a first channel film disposed in a columnar shape along an inner wall surface of the first memory film over the one side and the another side of the short diameter direction of the ellipse of the elliptic cylinder region;

a second channel film disposed in a columnar shape along an inner wall surface of the second memory film over the one side and the another side of the short diameter direction of the ellipse of the elliptic cylinder region; and a second dielectric film wall configured to separate the first wire groups and the second wire groups.

9. The device according to claim 8, wherein each of the first and second memory films includes an aluminum oxide ($Al_2O_3$) film functioning as a block dielectric film disposed in a tubular shape to be continuous in the longitudinal direction of the elliptic cylinder region.

10. The device according to claim 8, wherein the first dielectric film wall is contactlessly disposed with the second dielectric film wall, and a direction of a wall surface of the first dielectric film wall is oriented in a different direction with a direction of a wall surface of the second dielectric film wall.

11. The device according to claim 8, wherein the plurality of layers of the first wire groups and the plurality of layers of the second wire groups extend in the long diameter direction of the ellipse of the elliptic cylinder region.

12. The device according to claim 8, wherein the first channel film is disposed in the columnar shape along an entire circumference of the inner wall surface of the first memory film, and the second channel film is disposed in the columnar shape along an entire circumference of the inner wall surface of the second memory film.

13. The device according to claim 8, wherein the first memory film and the second memory film are disposed to contact wall surfaces opposite to each other respectively in both wall surfaces of the first dielectric film wall.

14. The device according to claim 11, wherein a plurality of elliptic cylinder regions each of which is provided with the first dielectric film wall, the first and second memory films, and the first and second channel films, and a plurality of portions where the plurality of layers of the first wire groups and the plurality of layers of the second wire groups face each other with the second dielectric film wall therebetween, are alternately arranged in the long diameter direction of the ellipse of the elliptic cylinder region.

15. The device according to claim 14, wherein the plurality of layers of the first wire groups are connected to parts of the first and second memory films of each of the plurality of elliptic cylinder regions on one side of a short diameter direction of an ellipse of each of the plurality of elliptic cylinder regions, and the plurality of layers of the second wire groups are connected to another parts of the first and second memory films of each of the plurality of elliptic cylinder regions on another side of the short diameter direction of the ellipse of each of the plurality of elliptic cylinder regions.

16. A semiconductor device comprising:

first and second dielectric film walls configured to separate one elliptic cylinder region in a long diameter direction and a short diameter direction of an ellipse to form first to fourth regions;

a first memory film disposed in a tubular shape along a sidewall surface of the first region of the elliptic cylinder region separated by the first and second dielectric film walls and having a first charge accumulation film;

a second memory film disposed in a tubular shape along a sidewall surface of the second region of the elliptic cylinder region separated by the first and second dielectric film walls and having a second charge accumulation film;

a third memory film disposed in a tubular shape along a sidewall surface of the third region of the elliptic cylinder region separated by the first and second dielectric film walls, coupled to the first memory film on a layer side lower than the second dielectric film wall, and having a third charge accumulation film;

a fourth memory film disposed in a tubular shape along a sidewall surface of the fourth region of the elliptic cylinder region separated by the first and second dielectric film walls, coupled to the second memory film on the layer side lower than the second dielectric film wall, and having a fourth charge accumulation film;

first wire groups provided in a plurality of layers in a longitudinal direction of the elliptic cylinder region, each of the first wire groups having a plate shape, extending in a direction orthogonal to the longitudinal direction of the elliptic cylinder region, and being connected to the first and second memory films;

second wire groups provided in a plurality of layers being the same layers as the first wire groups, each of the second wire groups having a plate shape, being parallel to the first wire groups, extending in the direction orthogonal to the longitudinal direction of the elliptic cylinder region, and being connected to the third and fourth memory films;

a first channel film disposed in a columnar shape along an inner wall surface of the first memory film;

a second channel film disposed in a columnar shape along an inner wall surface of the second memory film;

a third channel film disposed in a columnar shape along an inner wall surface of the third memory film and coupled to the first channel film on the layer side lower than the second dielectric film wall; and a fourth channel film disposed in a columnar shape along an inner wall surface of the fourth memory film and coupled to the second channel film on the layer side lower than the second dielectric film wall, wherein the second dielectric film wall further separates the first wire groups and the second wire groups.

17. The device according to claim 16, wherein the first channel film and the third channel film are connected in a U shape, and the second channel film and the fourth channel film are connected in a U shape.

18. The device according to claim 16, wherein a set of the first channel film and the third channel film is disposed not to contact a set of the second channel film and the fourth channel film.

19. The device according to claim 16, wherein the plurality of layers of the first wire groups and the plurality of layers of the second wire groups extend in the long diameter direction of the ellipse of the elliptic cylinder region.

20. The device according to claim 16, wherein the first channel film is disposed in the columnar shape along an entire circumference of the inner wall surface of the first memory film,
   the second channel film is disposed in the columnar shape along an entire circumference of the inner wall surface of the second memory film,
   the third channel film is disposed in the columnar shape along an entire circumference of the inner wall surface of the third memory film, and
   the fourth channel film is disposed in the columnar shape along an entire circumference of the inner wall surface of the fourth memory film.

* * * * *